United States Patent
Chung

(10) Patent No.: US 11,615,859 B2
(45) Date of Patent: Mar. 28, 2023

(54) ONE-TIME PROGRAMMABLE MEMORIES WITH ULTRA-LOW POWER READ OPERATION AND NOVEL SENSING SCHEME

(71) Applicant: Attopsemi Technology Co., LTD, Hsinchu (TW)

(72) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

(21) Appl. No.: 17/373,733

(22) Filed: Jul. 12, 2021

(65) Prior Publication Data

US 2021/0343355 A1    Nov. 4, 2021

Related U.S. Application Data

(63) Continuation-in-part of application No. 16/931,314, filed on Jul. 16, 2020, now Pat. No. 11,062,786, which is a continuation-in-part of application No. 16/559,560, filed on Sep. 3, 2019, now Pat. No. 10,726,914, which is a continuation-in-part of application No. 15/953,422, filed on Apr. 14, 2018, now Pat. No. 10,535,413.

(60) Provisional application No. 62/485,895, filed on Apr. 14, 2017.

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ....... G11C 17/18; G11C 17/16; G11C 17/165; G11C 13/004
USPC .................................................. 365/96, 158
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |

(Continued)

FOREIGN PATENT DOCUMENTS

| CN | 1469473 A | 1/2004 |
|---|---|---|
| CN | 1691204 A | 11/2005 |

(Continued)

OTHER PUBLICATIONS

U.S. Appl. No. 13/471,704, filed May 15, 2012.

(Continued)

*Primary Examiner* — Michael T Tran

(57) ABSTRACT

An OTP with ultra-low power read can be programmed with a minimum and a maximum program voltage. When programming within the range, the post-program OTP to pre-program resistance ratio can be larger than N, where N>50, so that more sensing techniques, such as single-end sensing, can be used to reduce read current. At least one of the OTP cells can be coupled to a common bitline, which can be further coupled to a first supply voltage lines via a plurality of datalines. The resistance in the at least one OTP cell can be evaluated by strobing at least one comparator output of the discharging bitline/dataline.

20 Claims, 13 Drawing Sheets

(56) References Cited

U.S. PATENT DOCUMENTS

| | | | |
|---|---|---|---|
| 4,879,689 | A | 11/1989 | Atsumi |
| 5,192,989 | A | 3/1993 | Matsushita et al. |
| 5,355,342 | A | 10/1994 | Ueoka |
| 5,389,552 | A | 2/1995 | Iranmanesh |
| 5,447,876 | A | 9/1995 | Moyer et al. |
| 5,536,968 | A | 7/1996 | Crafts |
| 5,548,225 | A | 8/1996 | Rountree |
| 5,600,588 | A | 2/1997 | Kawashima |
| 5,610,871 | A | 3/1997 | Hidaka |
| 5,635,742 | A | 6/1997 | Hoshi et al. |
| 5,637,901 | A | 6/1997 | Beigel et al. |
| 5,723,890 | A | 3/1998 | Fujihira et al. |
| 5,747,805 | A | 5/1998 | Youngquist |
| 5,757,046 | A | 5/1998 | Fujihira et al. |
| 5,761,148 | A | 6/1998 | Allan et al. |
| 5,962,903 | A | 10/1999 | Sung et al. |
| 5,973,900 | A | 10/1999 | Sher |
| 6,002,156 | A | 12/1999 | Lin |
| 6,008,092 | A | 12/1999 | Gould |
| 6,034,882 | A | 3/2000 | Johnson et al. |
| 6,054,344 | A | 4/2000 | Liang et al. |
| 6,108,247 | A | 8/2000 | Suzu |
| 6,128,239 | A | 10/2000 | Perner |
| 6,140,687 | A | 10/2000 | Shimomura et al. |
| 6,215,681 | B1 | 4/2001 | Schuurman |
| 6,222,244 | B1 | 4/2001 | Arndt et al. |
| 6,243,864 | B1 | 6/2001 | Odani et al. |
| 6,249,472 | B1 | 6/2001 | Tamura et al. |
| 6,346,727 | B1 | 2/2002 | Ohtomo |
| 6,388,292 | B1 | 5/2002 | Lin |
| 6,400,540 | B1 | 6/2002 | Chang |
| 6,405,160 | B1 | 6/2002 | Djaja et al. |
| 6,461,934 | B2 | 10/2002 | Nishida et al. |
| 6,483,734 | B1 | 11/2002 | Sharma et al. |
| 6,597,629 | B1 | 7/2003 | Raszka et al. |
| 6,611,043 | B2 | 8/2003 | Takiguchi |
| 6,728,137 | B1 | 4/2004 | Lin |
| 6,731,535 | B1 | 5/2004 | Ooishi et al. |
| 6,770,953 | B2 | 8/2004 | Boeck et al. |
| 6,798,684 | B2 | 9/2004 | Low et al. |
| 6,803,804 | B2 | 10/2004 | Madurawe |
| 6,813,705 | B2 | 11/2004 | Duesterwald et al. |
| 6,897,543 | B1 | 5/2005 | Huang et al. |
| 6,934,176 | B2 | 8/2005 | Low et al. |
| 6,944,083 | B2 | 9/2005 | Pedlow |
| 6,967,879 | B2 | 11/2005 | Mizukoshi |
| 7,009,182 | B2 | 3/2006 | Kannan et al. |
| 7,102,951 | B2 | 9/2006 | Paillet et al. |
| 7,167,397 | B2 | 1/2007 | Paillet et al. |
| 7,211,843 | B2 | 5/2007 | Low et al. |
| 7,212,432 | B2 | 5/2007 | Ferrant et al. |
| 7,224,598 | B2 | 5/2007 | Perner |
| 7,263,027 | B2 | 8/2007 | Kim et al. |
| 7,294,542 | B2 | 11/2007 | Okushima |
| 7,369,452 | B2 | 5/2008 | Kenkare et al. |
| 7,391,064 | B1 | 6/2008 | Tripsas et al. |
| 7,405,590 | B1 | 7/2008 | Kaneko |
| 7,411,844 | B2 | 8/2008 | Nitzan et al. |
| 7,439,608 | B2 | 10/2008 | Arendt |
| 7,450,414 | B2 | 11/2008 | Scheuerlein |
| 7,461,371 | B2 | 12/2008 | Luo et al. |
| 7,573,762 | B2 | 8/2009 | Kenkare et al. |
| 7,579,232 | B1 | 8/2009 | Ping |
| 7,589,367 | B2 | 9/2009 | Oh et al. |
| 7,609,578 | B2 | 10/2009 | Buer et al. |
| 7,660,181 | B2 | 2/2010 | Kumar et al. |
| 7,696,017 | B1 | 4/2010 | Tripsas et al. |
| 7,701,038 | B2 | 4/2010 | Chen et al. |
| 7,759,766 | B2 | 7/2010 | Booth |
| 7,764,532 | B2 | 7/2010 | Kurjanowicz et al. |
| 7,772,591 | B1 | 8/2010 | Shih et al. |
| 7,802,057 | B2 | 9/2010 | Iyer et al. |
| 7,808,815 | B2 | 10/2010 | Ro et al. |
| 7,830,697 | B2 | 11/2010 | Herner |
| 7,833,823 | B2 | 11/2010 | Klersy |
| 7,834,659 | B1 | 11/2010 | Im et al. |
| 7,852,656 | B2 | 12/2010 | Shin et al. |
| 7,859,920 | B2 | 12/2010 | Jung |
| 7,889,204 | B2 | 2/2011 | Hansen et al. |
| 7,910,999 | B2 | 3/2011 | Lee et al. |
| 8,008,723 | B2 | 8/2011 | Nagai |
| 8,050,129 | B2 | 11/2011 | Liu et al. |
| 8,089,137 | B2 | 1/2012 | Lung et al. |
| 8,115,280 | B2 | 2/2012 | Chen et al. |
| 8,119,048 | B2 | 2/2012 | Nishimura |
| 8,154,005 | B2 | 4/2012 | Hsia |
| 8,168,538 | B2 | 5/2012 | Chen et al. |
| 8,174,063 | B2 | 5/2012 | Liu et al. |
| 8,174,922 | B2 | 5/2012 | Naritake |
| 8,179,711 | B2 | 5/2012 | Kim et al. |
| 8,183,665 | B2 | 5/2012 | Bertin et al. |
| 8,203,899 | B2 | 6/2012 | Chen |
| 8,217,490 | B2 | 7/2012 | Bertin et al. |
| 8,233,316 | B2 | 7/2012 | Liu et al. |
| 8,339,079 | B2 | 12/2012 | Yamada |
| 8,369,166 | B2 | 2/2013 | Kurjanowicz et al. |
| 8,373,254 | B2 | 2/2013 | Chen et al. |
| 8,380,768 | B2 | 2/2013 | Hoefler |
| 8,415,764 | B2 | 4/2013 | Chung |
| 8,482,972 | B2 | 7/2013 | Chung |
| 8,488,359 | B2 | 7/2013 | Chung |
| 8,488,364 | B2 | 7/2013 | Chung |
| 8,503,141 | B2 | 8/2013 | Mallikarjunaswamy |
| 8,514,606 | B2 | 8/2013 | Chung |
| 8,526,254 | B2 | 9/2013 | Kurjanowicz et al. |
| 8,559,208 | B2 | 10/2013 | Chung |
| 8,570,800 | B2 | 10/2013 | Chung |
| 8,576,602 | B2 | 11/2013 | Chung |
| 8,598,639 | B2 | 12/2013 | Hsin |
| 8,607,019 | B2 | 12/2013 | Chung |
| 8,643,085 | B2 | 2/2014 | Pfirsch |
| 8,644,049 | B2 | 2/2014 | Chung |
| 8,648,349 | B2 | 2/2014 | Masuda et al. |
| 8,649,203 | B2 | 2/2014 | Chung |
| 8,680,620 | B2 | 3/2014 | Salcedo |
| 8,699,259 | B2 | 4/2014 | Zhang et al. |
| 8,760,904 | B2 | 6/2014 | Chung |
| 8,804,398 | B2 | 8/2014 | Chung |
| 8,817,563 | B2 | 8/2014 | Chung |
| 8,830,720 | B2 | 9/2014 | Chung |
| 8,848,423 | B2 | 9/2014 | Chung |
| 8,854,859 | B2 | 10/2014 | Chung |
| 8,861,249 | B2 | 10/2014 | Chung |
| 8,913,415 | B2 | 12/2014 | Chung |
| 8,913,449 | B2 | 12/2014 | Chung |
| 8,923,070 | B2 | 12/2014 | Xia |
| 8,923,085 | B2 | 12/2014 | Chung |
| 8,929,122 | B2 | 1/2015 | Chung |
| 8,988,965 | B2 | 3/2015 | Chung |
| 9,019,742 | B2 | 4/2015 | Chung |
| 9,019,791 | B2 | 4/2015 | Chung |
| 9,025,357 | B2 | 5/2015 | Chung |
| 9,070,437 | B2 | 6/2015 | Chung |
| 9,178,100 | B2 | 11/2015 | Webster |
| 9,236,141 | B2 | 1/2016 | Chung |
| 9,245,648 | B1 * | 1/2016 | Li .................. G11C 17/18 |
| 9,281,038 | B2 | 3/2016 | Chung |
| 9,305,973 | B2 | 4/2016 | Chung |
| 9,324,447 | B2 | 4/2016 | Chung |
| 9,324,849 | B2 | 4/2016 | Chung |
| 9,343,176 | B2 | 5/2016 | Chung |
| 9,449,687 | B1 | 9/2016 | Piccardi |
| 9,460,807 | B2 | 10/2016 | Chung |
| 9,478,306 | B2 | 10/2016 | Chung |
| 9,548,109 | B2 | 1/2017 | Chung |
| 9,548,131 | B1 | 1/2017 | Bill |
| 9,613,714 | B1 * | 4/2017 | Wong .................. G06F 12/1408 |
| 9,767,915 | B2 | 9/2017 | Chung |
| 9,818,478 | B2 | 11/2017 | Chung |
| 9,838,025 | B1 | 12/2017 | Deng |
| 9,852,783 | B1 | 12/2017 | Na |
| 9,981,970 | B2 | 1/2018 | Chung |
| 10,192,615 | B2 | 1/2019 | Chung |
| 10,541,025 | B2 | 1/2020 | Nazarian |

(56) References Cited

U.S. PATENT DOCUMENTS

| | | | |
|---|---|---|---|
| 10,586,832 B2 | 3/2020 | Chung | |
| 10,916,317 B2 | 2/2021 | Chung | |
| 2001/0007541 A1 | 7/2001 | Hirakawa | |
| 2002/0018355 A1 | 2/2002 | Johnson et al. | |
| 2002/0042636 A1 | 4/2002 | Koshiol | |
| 2002/0075744 A1 | 6/2002 | McCollum | |
| 2002/0168821 A1 | 11/2002 | Williams et al. | |
| 2002/0196659 A1 | 12/2002 | Hurst et al. | |
| 2003/0043616 A1 | 3/2003 | Baker | |
| 2003/0104860 A1 | 6/2003 | Cannon et al. | |
| 2003/0135709 A1 | 7/2003 | Niles et al. | |
| 2003/0169625 A1 | 9/2003 | Hush et al. | |
| 2004/0057271 A1 | 3/2004 | Parkinson | |
| 2004/0100845 A1 | 5/2004 | Subramanian | |
| 2004/0113183 A1 | 6/2004 | Karpov et al. | |
| 2004/0130924 A1 | 7/2004 | Ma et al. | |
| 2005/0013162 A1 | 1/2005 | Jeon | |
| 2005/0052915 A1 | 3/2005 | Herner | |
| 2005/0056825 A1 | 3/2005 | Berlin | |
| 2005/0060500 A1 | 3/2005 | Luo et al. | |
| 2005/0062110 A1 | 3/2005 | Dietz et al. | |
| 2005/0093092 A1 | 5/2005 | Tran | |
| 2005/0110081 A1 | 5/2005 | Pendharkar | |
| 2005/0124116 A1 | 6/2005 | Hsu et al. | |
| 2005/0146962 A1 | 7/2005 | Schreck | |
| 2005/0242386 A1 | 11/2005 | Ang | |
| 2006/0067099 A1 | 3/2006 | Kim | |
| 2006/0072357 A1 | 4/2006 | Wicker | |
| 2006/0092689 A1 | 5/2006 | Braun et al. | |
| 2006/0104111 A1 | 5/2006 | Tripsas et al. | |
| 2006/0108575 A1 | 5/2006 | Lee et al. | |
| 2006/0120148 A1 | 6/2006 | Kim et al. | |
| 2006/0129782 A1 | 6/2006 | Bansal et al. | |
| 2006/0215440 A1 | 9/2006 | Cho et al. | |
| 2006/0244099 A1 | 11/2006 | Kurjanowicz | |
| 2006/0285385 A1 | 12/2006 | Kuo | |
| 2007/0004160 A1 | 1/2007 | Voidman | |
| 2007/0008776 A1 | 1/2007 | Scheuerlein et al. | |
| 2007/0030026 A1 | 2/2007 | Hsu et al. | |
| 2007/0057323 A1 | 3/2007 | Furukawa et al. | |
| 2007/0058422 A1 | 3/2007 | Phillips | |
| 2007/0058473 A1 | 3/2007 | Kouchi | |
| 2007/0081377 A1 | 4/2007 | Zheng et al. | |
| 2007/0133341 A1 | 6/2007 | Lee et al. | |
| 2007/0138549 A1 | 6/2007 | Wu et al. | |
| 2007/0164347 A1 | 7/2007 | Kim | |
| 2007/0166937 A1 | 7/2007 | Adetutu | |
| 2007/0183213 A1 | 8/2007 | Kusakabe | |
| 2007/0218665 A1 | 9/2007 | Sutardja | |
| 2007/0223266 A1 | 9/2007 | Chen | |
| 2007/0279978 A1 | 12/2007 | Ho et al. | |
| 2007/0284656 A1 | 12/2007 | Radigan | |
| 2008/0025067 A1 | 1/2008 | Scheuerlein et al. | |
| 2008/0025068 A1 | 1/2008 | Scheuerlein et al. | |
| 2008/0028134 A1 | 1/2008 | Matsubara et al. | |
| 2008/0044959 A1 | 2/2008 | Cheng et al. | |
| 2008/0067601 A1 | 3/2008 | Chen | |
| 2008/0105878 A1 | 5/2008 | Ohara | |
| 2008/0137401 A1 | 6/2008 | Philipp | |
| 2008/0144354 A1 | 6/2008 | Choi | |
| 2008/0151612 A1 | 6/2008 | Pellizzer et al. | |
| 2008/0170429 A1 | 7/2008 | Bertin et al. | |
| 2008/0175060 A1 | 7/2008 | Liu et al. | |
| 2008/0185568 A1 | 8/2008 | Kwon | |
| 2008/0198643 A1* | 8/2008 | Shin | G11C 17/18 365/96 |
| 2008/0205115 A1 | 8/2008 | Ho | |
| 2008/0220560 A1 | 9/2008 | Klersy | |
| 2008/0225567 A1 | 9/2008 | Burr et al. | |
| 2008/0280401 A1 | 11/2008 | Burr et al. | |
| 2008/0310236 A1 | 12/2008 | Baker | |
| 2008/0316852 A1 | 12/2008 | Matsufuji et al. | |
| 2009/0039420 A1 | 2/2009 | Trivedi | |
| 2009/0055617 A1 | 2/2009 | Bansal et al. | |
| 2009/0115021 A1 | 5/2009 | Moriwaki | |
| 2009/0141573 A1 | 6/2009 | Hsueh | |
| 2009/0168493 A1 | 7/2009 | Kim et al. | |
| 2009/0172315 A1 | 7/2009 | Iyer et al. | |
| 2009/0180310 A1 | 7/2009 | Shimomura et al. | |
| 2009/0194839 A1 | 8/2009 | Bertin et al. | |
| 2009/0213660 A1 | 8/2009 | Pikhay et al. | |
| 2009/0219756 A1 | 9/2009 | Schroegmeier et al. | |
| 2009/0251943 A1 | 10/2009 | Kurjanowicz | |
| 2009/0269932 A1 | 10/2009 | Chen | |
| 2009/0273964 A1 | 11/2009 | Yamazaki | |
| 2009/0296933 A1 | 12/2009 | Akselrod | |
| 2009/0309089 A1 | 12/2009 | Hsia et al. | |
| 2010/0002501 A1 | 1/2010 | Leuschner | |
| 2010/0027326 A1 | 2/2010 | Kim et al. | |
| 2010/0034016 A1 | 2/2010 | Liu et al. | |
| 2010/0061136 A1 | 3/2010 | Koyama et al. | |
| 2010/0080035 A1 | 4/2010 | Venkatraman | |
| 2010/0085798 A1 | 4/2010 | Lu et al. | |
| 2010/0091546 A1 | 4/2010 | Liu et al. | |
| 2010/0103721 A1 | 4/2010 | Guha | |
| 2010/0110814 A1 | 5/2010 | Shimogawa | |
| 2010/0142254 A1 | 6/2010 | Choi et al. | |
| 2010/0157651 A1 | 6/2010 | Kumar et al. | |
| 2010/0171086 A1 | 7/2010 | Lung et al. | |
| 2010/0177547 A1 | 7/2010 | Shen | |
| 2010/0201410 A1 | 8/2010 | Illegems | |
| 2010/0219392 A1 | 9/2010 | Awaya | |
| 2010/0232203 A1 | 9/2010 | Chung et al. | |
| 2010/0238701 A1 | 9/2010 | Tsukamoto et al. | |
| 2010/0246237 A1 | 9/2010 | Borot et al. | |
| 2010/0250974 A1 | 9/2010 | Ristic | |
| 2010/0271064 A1 | 10/2010 | Kohler | |
| 2010/0277967 A1 | 11/2010 | Lee et al. | |
| 2010/0301304 A1 | 12/2010 | Chen et al. | |
| 2010/0301926 A1 | 12/2010 | Dell | |
| 2010/0321976 A1 | 12/2010 | Jung | |
| 2011/0022648 A1 | 1/2011 | Harris et al. | |
| 2011/0051491 A1 | 3/2011 | Takizawa | |
| 2011/0062557 A1 | 3/2011 | Bandyopadhyay et al. | |
| 2011/0108926 A1 | 5/2011 | Bahl | |
| 2011/0127627 A1 | 6/2011 | Hoofman | |
| 2011/0128772 A1 | 6/2011 | Kim et al. | |
| 2011/0145777 A1 | 6/2011 | Iyer et al. | |
| 2011/0175199 A1 | 7/2011 | Lin et al. | |
| 2011/0186990 A1 | 8/2011 | Mawatari | |
| 2011/0222330 A1 | 9/2011 | Lee et al. | |
| 2011/0235388 A1 | 9/2011 | Nakano | |
| 2011/0260289 A1 | 10/2011 | Oyamada | |
| 2011/0267869 A1 | 11/2011 | Hoefler | |
| 2011/0286261 A1 | 11/2011 | Sakuguchi | |
| 2011/0297912 A1 | 12/2011 | Samachisa et al. | |
| 2011/0310655 A1 | 12/2011 | Kreupl et al. | |
| 2011/0312166 A1 | 12/2011 | Yedinak et al. | |
| 2012/0032303 A1 | 2/2012 | Elkareh et al. | |
| 2012/0039107 A1 | 2/2012 | Chung | |
| 2012/0044736 A1 | 2/2012 | Chung | |
| 2012/0044737 A1 | 2/2012 | Chung | |
| 2012/0044738 A1 | 2/2012 | Chung | |
| 2012/0044739 A1 | 2/2012 | Chung | |
| 2012/0044740 A1 | 2/2012 | Chung | |
| 2012/0044743 A1 | 2/2012 | Chung | |
| 2012/0044744 A1 | 2/2012 | Chung | |
| 2012/0044745 A1 | 2/2012 | Chung | |
| 2012/0044746 A1 | 2/2012 | Chung | |
| 2012/0044747 A1 | 2/2012 | Chung | |
| 2012/0044748 A1 | 2/2012 | Chung | |
| 2012/0044753 A1 | 2/2012 | Chung | |
| 2012/0044756 A1 | 2/2012 | Chung | |
| 2012/0044757 A1 | 2/2012 | Chung | |
| 2012/0044758 A1 | 2/2012 | Chung | |
| 2012/0047322 A1 | 2/2012 | Chung | |
| 2012/0074372 A1 | 3/2012 | Yang | |
| 2012/0074460 A1 | 3/2012 | Kitagawa | |
| 2012/0074507 A1 | 3/2012 | Jo | |
| 2012/0083090 A1 | 4/2012 | Tsai | |
| 2012/0106231 A1 | 5/2012 | Chung | |
| 2012/0120707 A1 | 5/2012 | Kim | |
| 2012/0147653 A1 | 6/2012 | Chung | |
| 2012/0147657 A1 | 6/2012 | Sekar et al. | |

(56) References Cited

U.S. PATENT DOCUMENTS

| | | |
|---|---|---|
| 2012/0182783 A1 | 7/2012 | Bedeschi |
| 2012/0195099 A1 | 8/2012 | Miao |
| 2012/0209888 A1 | 8/2012 | Chung |
| 2012/0224406 A1 | 9/2012 | Chung |
| 2012/0224413 A1 | 9/2012 | Zhang et al. |
| 2012/0256292 A1 | 10/2012 | Yu et al. |
| 2012/0257435 A1 | 10/2012 | Lin |
| 2012/0268980 A1 | 10/2012 | Awaya |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0003436 A1 | 1/2013 | Kumar |
| 2013/0006559 A1 | 1/2013 | Grosjean |
| 2013/0135503 A1 | 5/2013 | Park |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0268727 A1 | 10/2013 | Sohn |
| 2013/0286710 A1 | 10/2013 | Hall |
| 2013/0294136 A1 | 11/2013 | Siau |
| 2013/0307821 A1 | 11/2013 | Kogo |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0022004 A1 | 1/2014 | Luo |
| 2014/0071726 A1 | 3/2014 | Chung |
| 2014/0071751 A1 | 3/2014 | Kim |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0169063 A1 | 6/2014 | August |
| 2014/0211567 A1 | 7/2014 | Chung |
| 2014/0211577 A1 | 7/2014 | Ryu |
| 2014/0268985 A1* | 9/2014 | Nadkarni ............. G11C 5/025 365/103 |
| 2014/0269135 A1 | 9/2014 | Chung |
| 2014/0340954 A1 | 11/2014 | Chung |
| 2014/0369133 A1 | 12/2014 | Lee et al. |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0130509 A1 | 5/2015 | Herner |
| 2015/0137258 A1 | 5/2015 | Mittal |
| 2015/0187414 A1 | 7/2015 | Perner |
| 2015/0194433 A1 | 7/2015 | Ponoth |
| 2015/0200270 A1 | 7/2015 | Flachowsky |
| 2015/0206586 A1 | 7/2015 | Chang |
| 2015/0249428 A1 | 9/2015 | Huynh |
| 2015/0276500 A1 | 10/2015 | Walker |
| 2015/0326129 A1 | 11/2015 | Lin |
| 2015/0357032 A1* | 12/2015 | Tatsumura ........... G11C 13/003 365/72 |
| 2015/0380103 A1 | 12/2015 | Braun et al. |
| 2016/0003880 A1 | 1/2016 | Deschildre |
| 2016/0005492 A1 | 1/2016 | Barsilai |
| 2016/0034351 A1 | 2/2016 | Michael |
| 2016/0035423 A1 | 2/2016 | Nam |
| 2016/0055905 A1* | 2/2016 | Lee .................... G11C 13/0038 365/148 |
| 2016/0071582 A1 | 3/2016 | Chung |
| 2016/0078919 A1 | 3/2016 | Han |
| 2016/0149586 A1 | 5/2016 | Roh |
| 2016/0247580 A1 | 8/2016 | Chen |
| 2016/0268002 A1 | 9/2016 | Chen |
| 2016/0276042 A1 | 9/2016 | Pesavento |
| 2016/0276043 A1 | 9/2016 | Chung |
| 2016/0329810 A1 | 11/2016 | Lee et al. |
| 2016/0336062 A1 | 11/2016 | Buchanan |
| 2016/0358648 A1 | 12/2016 | Park |
| 2017/0053708 A1 | 2/2017 | Wong |
| 2017/0053716 A1 | 2/2017 | Kim |
| 2017/0076733 A1 | 3/2017 | Noguchi |
| 2017/0103699 A1 | 4/2017 | Lin |
| 2017/0110170 A1 | 4/2017 | Kong |
| 2017/0110512 A1 | 4/2017 | Chung |
| 2017/0149395 A1 | 5/2017 | Patel |
| 2017/0178745 A1 | 6/2017 | Chen |
| 2017/0199537 A1 | 7/2017 | Duong |
| 2017/0221544 A1 | 8/2017 | Baeck |
| 2017/0250187 A1 | 8/2017 | Taniguchi |
| 2017/0263313 A1 | 9/2017 | Chou |
| 2017/0271005 A1 | 9/2017 | Renane |
| 2017/0316834 A1 | 11/2017 | Huynh |
| 2017/0364276 A1 | 12/2017 | Bhuiyan |
| 2017/0365360 A1 | 12/2017 | Fackenthal |
| 2018/0005703 A1 | 1/2018 | Nguyen |
| 2018/0059958 A1 | 3/2018 | Ryan |
| 2018/0075906 A1 | 3/2018 | Chung |
| 2018/0095489 A1 | 4/2018 | Fang |
| 2018/0096730 A1 | 4/2018 | Vo |
| 2018/0097447 A1 | 4/2018 | Iorio |
| 2018/0301198 A1 | 4/2018 | Chung |
| 2018/0122817 A1 | 5/2018 | Ramaswamy |
| 2018/0204512 A1 | 7/2018 | Han |
| 2019/0279712 A1 | 9/2019 | Siau |
| 2019/0295641 A1* | 9/2019 | Conte ................ G11C 13/0004 |
| 2019/0303236 A1 | 10/2019 | Ellis |
| 2019/0325949 A1 | 10/2019 | Gupta |
| 2019/0341107 A1 | 11/2019 | Bertin |
| 2019/0341393 A1 | 11/2019 | Peng |
| 2019/0371394 A1 | 12/2019 | Yang |
| 2019/0371402 A1 | 12/2019 | Lin |
| 2019/0378551 A1 | 12/2019 | Kim |
| 2019/0378579 A1 | 12/2019 | Zhao |
| 2019/0378581 A1 | 12/2019 | Zhao |
| 2019/0392889 A1 | 12/2019 | Trivedi |
| 2019/0392893 A1 | 12/2019 | Yang |
| 2020/0105341 A1 | 4/2020 | Wu |
| 2020/0152284 A1 | 5/2020 | Ganesan |
| 2020/0194499 A1 | 6/2020 | Chung |
| 2020/0279605 A1 | 9/2020 | Hatcher |
| 2020/0327951 A1 | 10/2020 | Jung |
| 2021/0020226 A1* | 1/2021 | Lim ................... G11C 13/0026 |
| 2022/0238154 A1* | 7/2022 | Rummens .......... G11C 13/0061 |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |

(56) References Cited

FOREIGN PATENT DOCUMENTS

| | | |
|---|---|---|
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al., "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp., Jun. 2004, pp. 442-445.
Bedeschi, F. et al., "SET and RESET Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.

(56) References Cited

OTHER PUBLICATIONS

Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology," 7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. snd Sys.—II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.—Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

(56) References Cited

OTHER PUBLICATIONS

Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. 1/2 Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of LV Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, p. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.

(56) References Cited

OTHER PUBLICATIONS

Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact Rram (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug. 6, 2009, pp. 1-7.
Notice of Allowance for U.S. Appl. No. 13/761,097, dated Jul. 15, 2014.

(56) References Cited

OTHER PUBLICATIONS

Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15-µm shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, mailed Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice of Allowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for US Patent Application No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for US Patent Application No. 13,833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.

(56) References Cited

OTHER PUBLICATIONS

Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Arpil 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for US Patent Application No. 15,076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.
Notice of Allowance for U.S. Appl. No. 14/101,125, dated Jul. 10, 2017.
Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.
Notice of Allowance for U.S. Appl. No. 14/485,698, dated Oct. 16, 2017.
Final Office Action for U.S. Appl. No. 15/422,266, dated Jan. 22, 2018.
Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Office Action for U.S. Appl. No. 15/805,109, dated May 29, 2018.
Office Action for U.S. Appl. No. 14/485,698, dated Jun. 21, 2018.
Notice of Allowance for U.S. Appl. No. 15/884,362 dated Sep. 19, 2018.
Notice of Allowance for U.S. Appl. No. 15/708,116 dated Oct. 26, 2018.
Notice of Allowance for U.S. Appl. No. 14/485,698 dated Dec. 10, 2018.
Office Action for U.S. Appl. No. 15/953,422, dated Jan. 28, 2019.
Final Office Action for U.S. Appl. No. 15/953,422, dated May 14, 2019.
Office Action for U.S. Appl. No. 15/805,109, dated Jun. 26, 2019.
Office Action for U.S. Appl. No. 16/245,223, dated Aug. 8, 2019.
Notice of Allowance for U.S. Appl. No. 15/953,422, dated Sep. 5, 2019.
Notice of Allowance for U.S. Appl. No. 15/805,109, dated Nov. 27, 2019.
Office Action for U.S. Appl. No. 16/273,023, dated Nov. 27, 2019.
Notice of Allowance for U.S. Appl. No. 16/191,429 dated Dec. 9, 2019.
CN Office Action for 2014800519492, dated Mar. 8, 2019.
CN Office Action for 2014800519492, dated Aug. 28, 2019.
TW Office Action for 103132546 dated Apr. 25, 2016.
TW Search Report 103132546 dated Apr. 25, 2016.
EP Extended Search Report for EP 181511064.4 dated Apr. 6, 2018.
Office Action for U.S. Appl. No. 16/799,809, dated Sep. 18, 2020.
Notice of Allowance for U.S. Appl. No. 16/803,992, dated Oct. 7, 2020.
Office Action for U.S. Appl. No. 16/931,314, dated Oct. 29, 2020.
Examination Report for GB 2013530.7 dated Nov. 25, 2020.
Search Report for GB 20135307 dated Nov. 24, 2020.
Notice of Allowance for U.S. Appl. No. 16/931,314, dated Mar. 10, 2021.

\* cited by examiner

ONE-TIME PROGRAMMABLE MEMORIES WITH ULTRA-LOW POWER READ OPERATION AND NOVEL SENSING SCHEME

CROSS-REFERENCE TO RELATED APPLICATIONS

This application is a Continuation-In-Part of U.S. patent application Ser. No. 16/931,314, filed on Jul. 16, 2020 and entitled "ONE-TIME PROGRAMMABLE MEMORIES WITH LOW POWER READ OPERATION AND NOVEL SENSING SCHEME," which is hereby incorporated herein by reference, which in turn is a Continuation-In-Part of U.S. patent application Ser. No. 16/559,560, filed on Sep. 3, 2019 and entitled "PROGRAMMABLE RESISTIVE MEMORIES WITH LOW POWER READ OPERATION AND NOVEL SENSING SCHEME," which is hereby incorporated herein by reference, which in turn is a Continuation-In-Part of U.S. patent application Ser. No. 15/953,422, filed on Apr. 14, 2018 and entitled "LOW POWER READ OPERATION FOR PROGRAMMABLE RESISTIVE MEMORIES," which is hereby incorporated herein by reference, which claims priority benefit of U.S. Provisional Patent Application No. 62/485,895, filed on Apr. 14, 2017 and entitled "CIRCUIT AND SYSTEM OF ULTRA LOW VOLTAGE AND LOW CURRENT READ FOR PROGRAMMABLE RESISTIVE MEMORIES," which is hereby incorporated herein by reference.

BACKGROUND OF THE INVENTION

Field of the Invention

The present invention relates to a sensing circuit for converting resistance in programmable resistive devices into logic states. The programmable resistive device memories are OTP, MTP, PCRAM, FeRAM, RRAM, and MRAM, etc.

Description of the Related Art

A Programmable Resistive Device (PRD) is generally referred to a device whose resistance can be changed by means of programming. Resistance states can also be determined by resistance values. For example, a programmable resistive device can be a One-Time Programmable (OTP) device, such as electrical fuse (or anti-fuse), and the programming means can apply a high voltage to induce a high current to flow through the OTP element. When a high current flows through an OTP element (e.g., by turning on a selector), the OTP element can be programmed, or burned into a high or low resistance state (depending on either fuse or anti-fuse).

FIG. 1 shows a schematic diagram of a conventional Programmable Resistive Device (PRD) 10 that has a Programmable Resistive Element (PRE) 11 and a selector 12. The PRE 11 can be an electrical fuse, anti-fuse, floating-gate device, phase-change material, resistive RAM element, or Magnetic Tunnel Junction (MTJ), etc. The selector 12 can be MOS, diode, MOS/diode merged, or even bipolar device that can be turned on or turned off by asserting a signal Sel.

The resistance of a PRE in a PRD device needs to be converted into a logic level after reading the PRD cell. This can be achieved by using a sensing circuit or sense amplifier (SA). The conventional way of sensing a PRE resistance is to convert the resistance value into a voltage by applying a current flowing through the PRE, then using a voltage amplifier to enlarge the voltage signal. This scheme depends on amplification of a MOS device that usually needs to be biased fully using a high voltage that consumes substantial amount of current to have high gain.

FIG. 2 is a schematic diagram of a conventional sense amplifier 20. The SA 20 has a PMOS 21 with the gate coupled to the drain. The gate of PMOS 21 is also coupled to a gate of PMOS 22. The sources of PMOS 21 and 22 are coupled to a supply voltage VDD. The drains of PMOS 21 and 22 are coupled to drains of NMOS 23 and 24, respectively. The gates of NMOS 23 and 24 are coupled to a differential input signal, Vp and Vn, respectively. The sources of NMOS 23 and 24 are coupled to a drain of a NMOS 26, whose gate is coupled to an enable signal $\psi$ and whose source is coupled to ground. The input differential voltage between Vp and Vn can be amplified to the output Vout, at the drain of PMOS 22. Device 27 is to pull Vout high when the circuit is disabled, i.e., NMOS 26 is turned off.

FIG. 3 is a schematic diagram of another conventional voltage sense amplifier 30. The scheme is to bias MOS devices in a latch into high gain region and then latching. Biasing MOS in high gain region normally requires substantial amount of current and operating in high voltage. A PMOS 31 has a source coupled to a supply voltage VDD, a drain coupled to a drain of an NMOS 33, whose source is coupled to a drain of another NMOS 35. The gate of NMOS 33 is coupled to an input voltage V+. The gate of NMOS 35 is coupled to the gate of PMOS 31. There is also another similar branch that has a PMOS 32 having a source coupled to a supply voltage VDD, a gate coupled to the drain of PMOS 31, a drain coupled to a drain of a NMOS 34, whose source is coupled to a drain of another NMOS 36. The gate of NMOS 34 is coupled to another input voltage V−. The gate of NMOS 36 is coupled to the gate of PMOS 32. The four devices 31, 35, 32, and 36 are interconnected like two cross-coupled inverters, i.e., the gates of 31 and 35 are coupled to the drain of PMOS 32, and the gates of 32 and 36 are coupled to the drain of PMOS 31. The sources of the NMOS 35 and 36 are coupled to a drain of an NMOS 39, whose gate is coupled to an enable signal $\psi$ and whose source is coupled to ground. The input differential signals of V+ and V− can be amplified to Vn and Vp, respectively, by turning on the enable signal $\psi$. Inverters 37 and 38 are buffers to the internal nodes Vn and Vp to generate outputs Vout+ and Vout−, respectively. Devices 40 pre-charges the internal nodes Vp and Vn to VDD when NMOS 39 is not turned on. In this embodiment, the input devices 33 and 34 are placed in the middle of the three MOS device stack. The input device 33 and 34 can be placed in top or bottom of the MOS stack in the other embodiments. There are also other embodiments of resistance sensing by replacing NMOS 33 and 34 by reference and cell resistance directly, respectively.

The conventional approaches to voltage sensing in FIG. 2 or FIG. 3 depend on the supply voltage VDD and MOS threshold voltages Vtn and Vtp to bias the MOS devices in high gain region, which normally needs some amount of current. If the supply voltage is 0.8V and the Vtn and |Vtp| are about 0.3V, sensing the PRD with only 0.4V would be very difficult for MOS to be in high gain regions. Even if the voltage sense amplifier was able to operate, the MOS bias current in high gain region would be substantially high for a sense amplifier (SA) to work. At least 100 uA would be needed to do so and achieving 1 uA of sensing current would be almost impossible. In IoT applications, there are some requests for sensing programmable resistive devices with only 0.4V voltage and 1 uA current, while the nominal supply voltage is 0.8V.

The conventional approaches to sensing resistance by converting into voltage require high supply voltage and high current. However, the industry trend in semiconductors is use of low supply voltage and low current consumption, especially in PC, tablet, smart phone, portable, and IoT applications. Thus, there is a continuing need for improved approaches to sense resistance of programmable resistive memory cells under low voltage and low current conditions.

SUMMARY OF THE INVENTION

Embodiments of sensing programmable resistive device cells in low supply voltage with ultra-low current are disclosed. The methods and circuits of low voltage and low current sensing can be used in any kind of programmable resistive memories, such as OTP, MTP, PCRAM, RRAM, FeRAM, and MRAM, etc. One or more of the embodiments disclosed herein can include or utilize techniques and circuitry that converts sensed resistance of programmable resistive devices into logic states.

In one embodiment, an OTP with ultra-low power read can be programmed with a minimum and a maximum program voltage. When programming within the range, the post-program OTP to pre-program resistance ratio can be larger than N, where N>50, so that more sensing techniques can be used to reduce read current. The minimum and the maximum program voltages to achieve the desirable high ratio can be found by programming a portion of OTP cells starting with a relative low program voltage, and incrementing the program voltage until the programmed OTP cells are verified as passed and achieving the high resistance ratio, which can be used to denote the minimum program voltage. Still incrementing the program voltage until at least one OTP cell is read as failed or unable to achieve the desirable resistance ratio, and thus the immediately previous program voltage can be used to denote the maximum program voltage.

In one embodiment, a capacitor can be charged to near a supply voltage level during a first period of time. Then, the capacitor can be discharged through a resistance over a second period of time. A voltage at the discharging capacitor can be compared with a reference voltage to change a memory read output. The time for an output logic device (e.g., comparison device) to change its output is determined by a product of the resistance and capacitance. Since the capacitance is or can be known, the time for the output logic device to change the output is related to the resistance value. Thus, the resistance can be determined by the time delay since start of the discharging. The longer the time delay, the larger the resistance. In one implementation, MOS devices are only used as switches to turn on or off for charging or discharging. Therefore, the threshold voltages of the MOS devices are not crucial in this time-based sensing scheme. In another embodiment, if the post-program resistance can be much higher than that of the pre-program, e.g., 50× or higher, using logic gates type of sensing, such as threshold voltage of an inverter, can save more current. In yet another embodiment, a combination of time-based and logic threshold sensing can be used to further reduce the sensing current.

The invention can be implemented in numerous ways, including as a method, system, device, or apparatus (including computer readable medium). Several embodiments of the invention are discussed below.

As an One-Time Programmable (OTP) memory, one embodiment of the invention can, for example, include at least a plurality of OTP cells, each of the OTP cells can include at least an OTP element coupled to a selector. The OTP element in at least one of the OTP cells can be coupled to a first supply voltage line. The selector in at least one of the OTP cells can include an enable signal and can be coupled to a second supply voltage line. The at least one OTP cell can be configured to be programmable within a minimum program voltage and a maximum program voltage by applying voltages to the first, second, and/or the enable signal to program the at least one OTP cell into another resistance state.

As an electronic system, one embodiment can, for example, include at least: a processor, and a one-time programmable (OTP) memory operatively connected to the processor. The OTP memory can include at least a plurality of OTP cells for providing data storage. Each of the OTP cells can include at least: a one-time programmable (OTP) element coupled to a selector that includes an enable signal, the OTP element can be coupled to a first supply voltage line, and the selector can be coupled to a second supply voltage line. The at least one OTP cell can be configured to be programmable within a minimum program voltage and a maximum program voltage by applying voltages to the first, second, and/or the enable signal to program the OTP cell into another resistance state.

As a method for operating a one-time programmable (OTP) memory, the method can, for example, include at least the method can, for example, include at least determining a minimum and a maximum program voltage to make a post-program to pre-program resistance ratio of at least N when programming within a voltage range between the minimum and the maximum program voltage. The OTP memory including a plurality of OTP cells, at least one of the OTP cells including a plurality of OTP elements and a selector, and the OTP element coupled to a selector. The at least one of the OTP elements can be coupled to a first supply voltage line, and the at least one selector can be coupled to a second supply voltage line.

As a programmable resistive memory, one embodiment can, for example, include at least a plurality of programmable resistive device (PRD) cells. At least one of the PRD cells can include at least: a selector controlled by a control signal, the selector having a at least a first end and a second end, the second end being coupled to a first conductive line; a programmable resistive element (PRE) having a first end coupled to a capacitor and a second end coupled to the first end of the selector; and a logic device can be coupled between the first end of the PRE and the capacitor as a switch or multiplexer. The charge/discharge rate of the capacitor can be used to determine the logic state of the PRE.

As an electronic system, one embodiment can, for example, include at least a processor, and a programmable resistive memory operatively connected to the processor. The programmable resistive memory can include at least a plurality of programmable resistive device (PRD) cells for providing data storage, each of the PRD cells can include at least: a selector controlled by a control signal, the selector having a first end and a second end, the second end being coupled to a first conductive line; a programmable resistive element (PRE) having a first end coupled to a capacitor and a second end coupled to the first end of the selector; and a logic device coupled between the first end of the PRE and the capacitor as a switch or multiplexer. The charge/discharge rate of the capacitor can be used to determine the logic state of the PRE.

As a method for providing a programmable resistive memory including a plurality of programmable resistive device cells and at least one capacitor. At least one of the programmable resistive device cells includes at least a programmable resistive element. One embodiment can, for example, include at least: charging the capacitor; ceasing the charging; subsequently coupling the programmable resistive element to the capacitor; monitoring a discharge rate of the capacitor while the programmable resistance element remains coupled to the capacitor; determining a resistance value of the programmable resistive element based on the monitoring of the discharge rate; and determining a logic state for the at least one of the programmable resistive device cells based in the determined resistance value of the programmable resistive element.

As a One-Time Programmable (OTP) memory, one embodiment can, for example, include at least a plurality of OTP cells, each of the OTP cells including an OTP element coupled to a selector, the selector having a control signal; a plurality of wordlines, each coupled to a plurality of the OTP cells via the control signal of the selector; a plurality of bitlines, each coupled to a plurality of at least one end of the OTP cells; at least one reference OTP cells, each of the reference OTP cells including a reference OTP element coupled to a reference selector, the reference selector having a control signal; at least one reference wordline, each coupled to the reference OTP cells via the control signal of the reference selector; and at least one reference bitline, each coupled to at least one end of the reference OTP cell. The bitlines and reference bitlines can be pre-charged and then are discharged at substantially the same time. The resistance of the OTP element is able to be determined by comparing the discharge rates of the bitline versus the reference bitline.

As an electronic system, one embodiment can, for example, include at least a processor; and a one-time programmable (OTP) memory operatively connected to the processor. The OTP memory includes at least a plurality of OTP cells for providing data storage. Each of the OTP cells can include at least: a one-time programmable (OTP) element coupled to a selector that has an enable signal; a plurality of wordlines coupled to the enable signals of the selector; a plurality of bitlines coupled to a first end of OTP cells; at least one reference OTP cell comprising a reference OTP resistor coupled to a reference selector that has a reference enable signal; at least one reference wordline coupled to the enable signal; and at least one bitline coupled to at least a first end of the reference OTP cells. Both the bitline and reference bitline are able to be pre-charged to one voltage supply line and discharged to another supply voltage at substantially the same time. The resistance of the OTP can be determined by comparing the discharge rates of the bitline and the reference bitline.

As a method for operating a one-time programmable (OTP) memory, one embodiment can, for example, operate the OTP memory to provide data storage. The OTP memory can, for example, include: a plurality of OTP cells, at least one of the OTP cells including a plurality of a OTP element and a selector, the OTP element coupled to a selector, a plurality of wordlines coupled to the enable signal of the selector of at least one OTP cell, a plurality of bitlines coupled to at least a first end of the OTP cells, at least one reference OTP cell, the at least one of the reference OTP cell including at least one reference OTP element coupled to a reference selector, at least one reference wordline coupled to the enable signal of the reference selector of at least one reference OTP cell, and at least one reference bitline coupled to at least a first end of the reference resistance cell. The method can, for example, include at least: charging the bitline and the reference bitline; ceasing charging the bitline and the reference bitline substantially at the same time; subsequently coupling the OTP element and the reference OTP element to the bitline and reference bitline, respectively; monitoring a discharge rate of the bitline and the reference bitline to reach a predetermined voltage threshold; and determining a logic state for the at least one of the OTP cells based on the discharge rates of the bitline to the reference bitline.

BRIEF DESCRIPTION OF THE DRAWINGS

The present invention will be readily understood by the following detailed descriptions in conjunction with the accompanying drawings, wherein like reference numerals designate like structural elements, and in which:

FIG. 5(b3) illustrated a schematic diagram of a comparator with resistors between the drains of a CMOS inverter, according to one embodiment.

FIG. 5(b4) illustrated a schematic diagram of a strobe comparator, according to one embodiment.

FIG. 5(b5) illustrated a schematic diagram of an OTP cell that has a combination of program selector and strobe read sense amplifier, according to another embodiment.

FIG. 5(b6) showed an I-V characteristic of programming an OTP with a large post-/pre-program resistance ratio according to the present invention.

FIG. 5(c1) illustrates a schematic diagram of a portion of a PRE memory utilizing time-base sensing, using at least one reference column according to one embodiment.

FIG. 5(c2) illustrates a schematic diagram of a portion of a PRE memory utilizing time-base sensing, using at least one reference column according to another embodiment.

DETAILED DESCRIPTION OF THE INVENTION

Embodiments disclosed herein use capacitors discharging through programmable resistance element (PRE) to evaluate a programming state. By comparing a discharging time to reach a predetermined voltage, a resistance of the PRE can be converted into a logic state. The discharging time can be compared with a discharge time provided by a separate unit that used a reference resistance. In one embodiment, an OTP with ultra-low power read can be programmed with a minimum and a maximum program voltage. When programming within the range, the post-program OTP to pre-program resistance ratio can be larger than N, where N>50, so that more sensing techniques can be used to reduce read current. The minimum and the maximum program voltages to achieve the desirable high ratio can be found by programming a portion of OTP cells starting with a relative low program voltage, and incrementing the program voltage until the programmed OTP cells are verified as passed and achieving the high resistance ratio, which can be used to denote the minimum program voltage. Still incrementing the program voltage until at least one OTP cell is read as failed or unable to achieve the desirable resistance ratio, and thus the immediately previous program voltage can be used to denote the maximum program voltage.

The programmable resistive element and a sensing circuit can be included in a Programmable Resistive Device (PRD) memory. Optionally, the programmable resistive element and the sensing circuit can be included within an electronic system.

The PRD can be a One-Time Programmable (OTP) device, such as electrical fuse (or anti-fuse). A current that flows through an OTP element (e.g., by turning on a selector) can program the OTP element or can burn the OTP element into a high or low resistance state (depending on either fuse or anti-fuse). The electrical fuse can be an interconnect or contact/via fuse. The interconnect fuse can be made of MOS gate, polysilicon, silicide, silicided polysilicon, metal, metal alloy, local interconnect, MOS gate, or thermally isolated active region. The contact or via fuse can be made of a single or a plurality of contact or via holes for programming. The anti-fuse can be made of breaking down a MOS oxide or a dielectric between conductors. The PRD can also be other kinds of memory devices, such as MTP, PCRAM, RRAM, FeRAM, and MRAM, etc. that can be programmed more than once.

Any MOS devices in this sensing circuit are used as switches. Therefore, their threshold voltages related to the supply voltage are not crucial to the operation of the circuit. Thus, low voltage and low current sensing can be achieved in standard CMOS logic process without additional masks or process steps to save costs.

Figure 1:
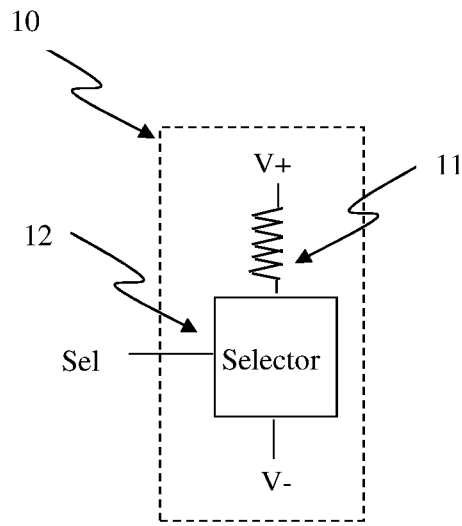
FIG. 1 shows a schematic diagram of a conventional programmable resistive memory device.
Figure 2:
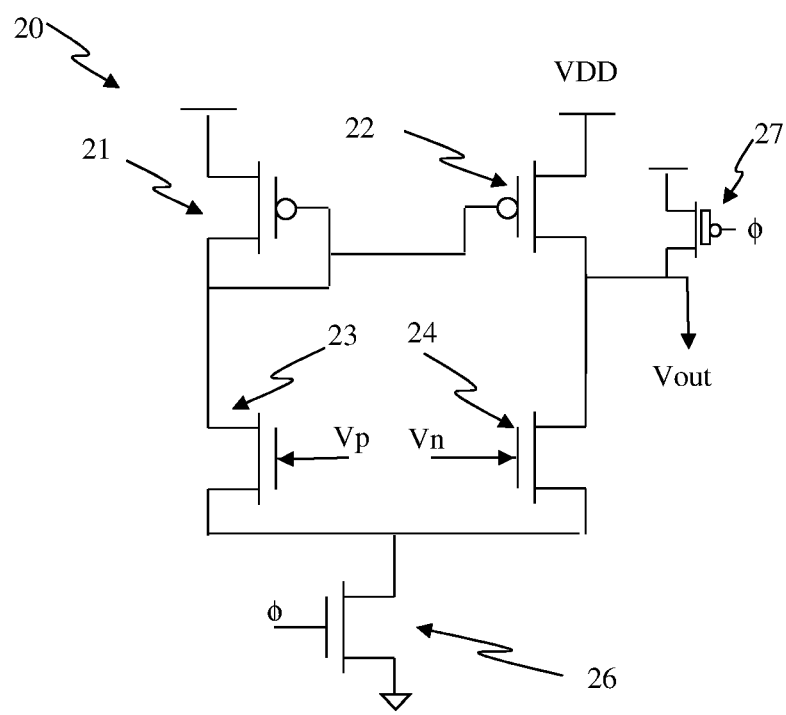
FIG. 2 shows a schematic diagram of a conventional voltage sense amplifier.
Figure 3:
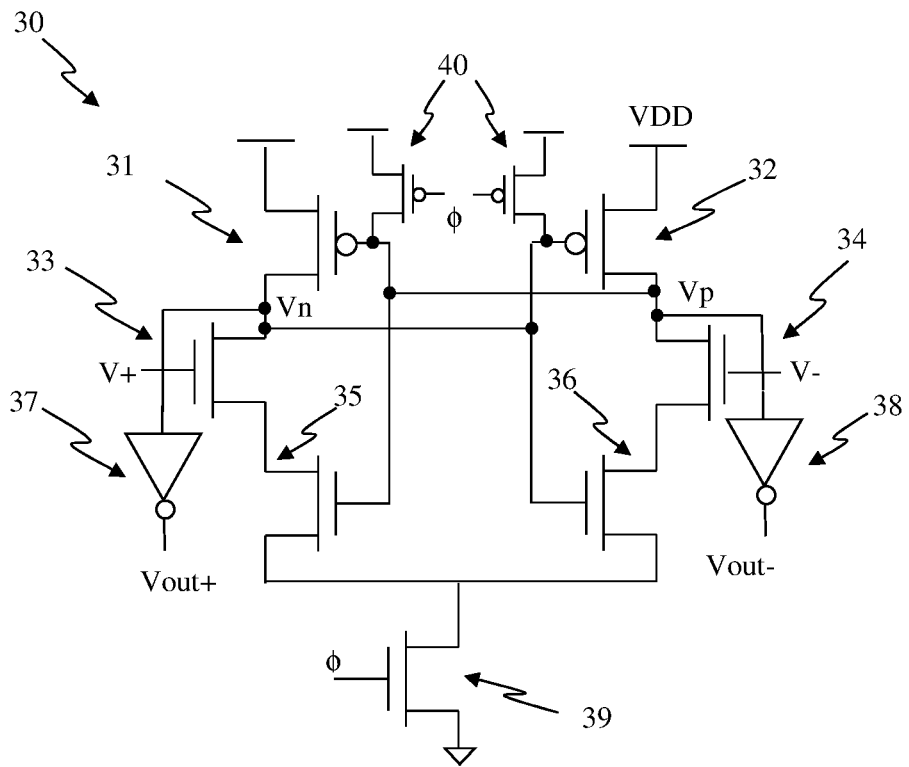
FIG. 3 shows a schematic diagram of another conventional voltage sense amplifier.
Figure 4A:
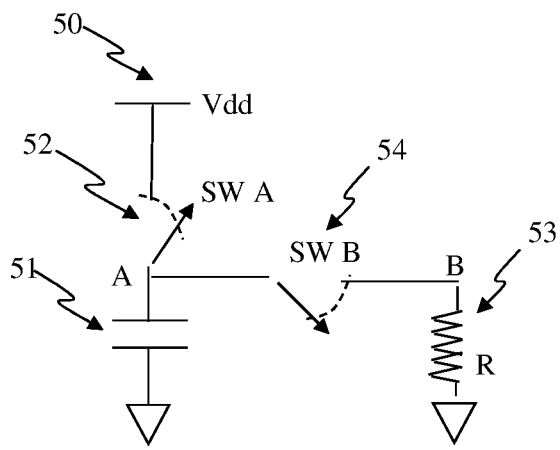
FIG. 4(a) illustrates a schematic diagram of a low power sensing circuit according to one embodiment.

FIG. 4(a) illustrates a schematic diagram of a portion of a low power sensing circuit 50 according to one embodiment. The sensing circuit 50 has a switch 52 coupled to a supply voltage VDD and to ground through a capacitor 51. The capacitor 51 is coupled to a switch 54 then to a resistive device 53 to ground. The capacitor 51 can be charged to VDD by turning on the switch 52 and turning off the switch 54. After the capacitor 51 is fully charged, the capacitor 51 can be discharged by turning on the switch 54 and turning off the switch 52. Thus, the voltage at node A at the capacitor 51 can be discharged to ground according to a RC-time constant. The RC-time constant is dependent on the product of resistance (R) and capacitance (C). Since the capacitance (C) of the capacitor 51 can be fixed, the discharge rate will depend on resistance (R) of the resistive device 53.

Figure 4B:
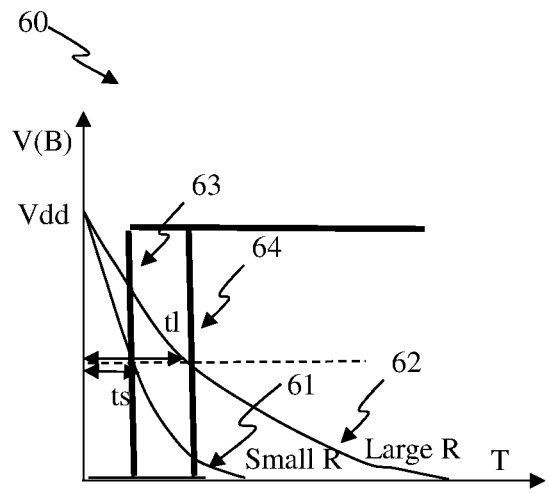
FIG. 4(b) illustrates a timing waveform of a voltage being discharged and the comparator output according to one embodiment.

FIG. 4(b) illustrates a timing waveform of a voltage at node B being discharged according to one embodiment. If the resistance of the resistive device 53 has a larger resistance than a reference resistance, the discharge curve would look like 62. Conversely, if the resistance of the resistive device 53 has a smaller resistance than the reference resistance, the discharge curve would look like 61. If one-half VDD (Vdd/2) is the predetermined voltage, time delays ts and tl for curves 61 and 62, respectively, to reach the predetermined voltage are as shown in FIG. 4(b) as logic waveforms 63, and 64 respectively. The larger the resistance, the longer the time delay. In other words, the sensing circuit 50 converts resistance into time, as is depicted in FIG. 4(b). If a comparator (not shown) is coupled to node B, the discharge waveforms of 61 and 62 after comparison can be raised to VDD as logic waveforms 63 and 64, respectively, after delay times ts and tl, respectively. By comparing the delay times ts and tl with a reference delay time, the resistance of the resistive device 53 can be determined.

Figure 5A:
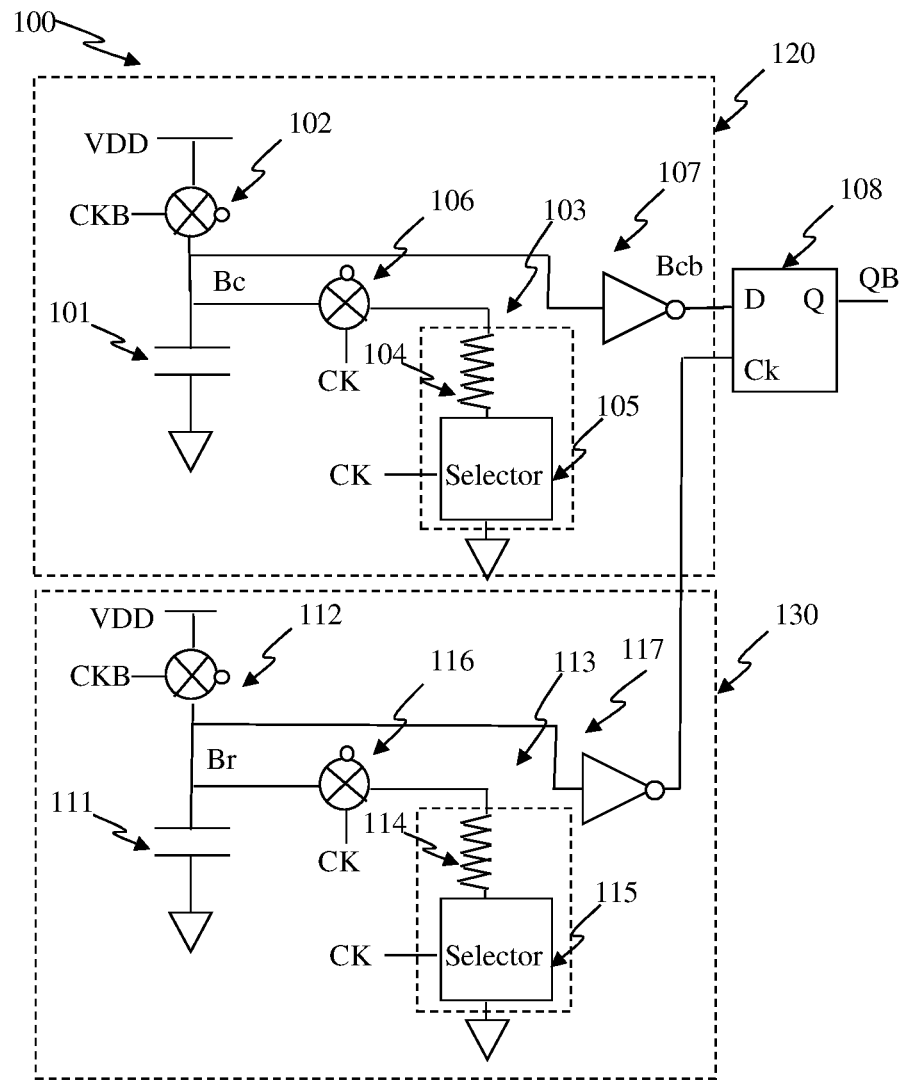
FIG. 5(a) illustrates a schematic diagram of time-based sensing circuit according to one embodiment.

FIG. 5(a) illustrates a portion of a schematic diagram of time-based sensing circuit 100, according to one embodiment. The time-based sensing circuit 100 has a cell unit 120 and a reference unit 130. The cell unit 120 has a capacitor 101 coupled to a supply voltage VDD through a charging pass gate 102 and coupled to a ground. The capacitor 101 is also coupled to a discharge pass gate 106. The discharge pass gate 106 couples to a programmable resistive device 103. The programmable resistive device 103 includes a programmable resistive element 104 coupled in series with a selector 105 that couples to ground. The discharge capacitor 101 is also coupled to an inverter 107, which can serve as a comparator or logic state converter.

The reference unit 130 has a capacitor 111 coupled to a supply voltage VDD through a charging pass gate 112 and coupled to a ground. The capacitor 111 is also coupled to a discharge pass gate 116. The discharge pass gate 116 couples to a reference device 113. The reference device 113 includes a reference element 114 coupled in series with a selector 115 that couples to ground. The capacitor 111 is also coupled to an inverter 117, which can serve as a comparator or a logic state converter. The output of the inverters 107 and 117 can be coupled to an input and an enable a latch (or flip-flop) 108, respectively. The output QB of the latch (or flip-flop) 108 can represent a logic state of the PRE 104 with respect to the reference element 114.

The operation of time-based sensing circuit can be further elaborated as follows. The cell unit 120 includes the capacitor 101 and the reference unit 130 includes the capacitor 111. The capacitors 101 and 111 typically have the same capacitance C. The capacitors 101 and 111 can be charged to near VDD with assertion of CKB which turns on the charge pass gates 102 and 112, while the discharge pass gates 106 and 116 are turned off. When the capacitors 101 and 111 are nearly full charged, the charge pass gates 102 and 112 can be turned off and the discharge pass gates 106 and 116 as well as the selectors 105 and 115 can be turned on. The capacitors 101 and 111 will then be respectively discharged through the resistance of the PRE 104 and the reference element 114. The capacitors 101 and 111 are also coupled to inverters 107 and 117, respectively, that serve as logic comparators to generate logic states. Before discharge, the outputs of the inverters 107 and 117, as comparators, are all 0 s. When the capacitor voltages have discharged below the trip points of the inverters 107 and 117, the outputs of the inverters 107 and 117 will be independently changed to 1 s. If the output of the inverter 117 is changed to 1, the latch (or flip-flop) 108 will be turned on to latch the output of the inverter 107. The output QB will be high if the resistance of the PRE 104 in the cell unit 120 has lower resistance than the resistance of reference element 114; otherwise, the latch (or flip-flop) 108 output QB will be low.

Figure 5B:
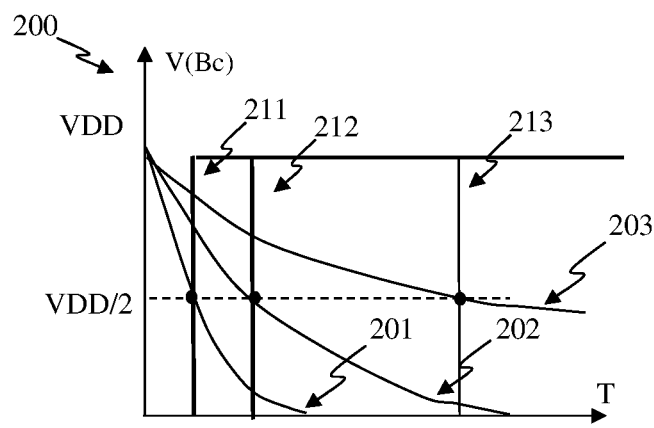
FIG. 5(b) illustrated a timing waveform of discharging capacitor voltages in a cell unit and a reference unit, according to one embodiment.

FIG. 5(b) illustrates a timing waveform 200 of the capacitor voltages at nodes Bc and Br in the cell unit 120 and the reference unit 130, respectively, according to one embodiment. A curve 202 shows discharging of the capacitor 111 in the reference unit 130. When the voltage at node Br reaches half VDD (Vdd/2), which is set as the trip point of the inverter 117, the output of the inverter 117 will become high. Then, the latch (or flip-flop) 108 can latch data 1 or 0 for curves 201 or 203, respectively, depending on whether the resistance of the PRE 104 in the cell unit 120 is lower or higher than the resistance of the reference element 114. Waveforms 211, 212, and 213 are comparator outputs of 201, 202, and 203, respectively.

Figure 5:
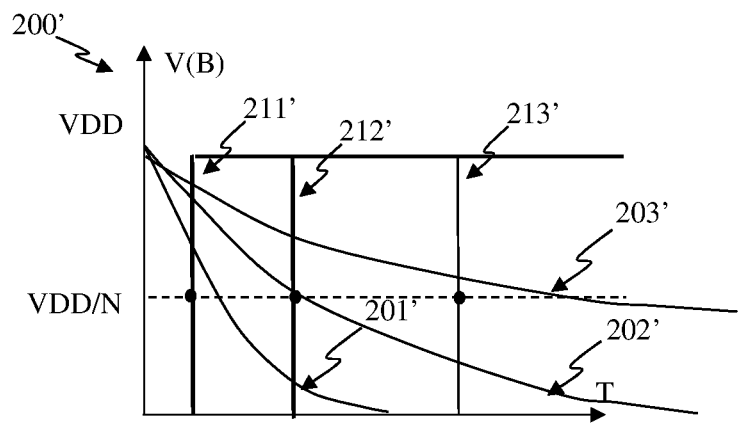
FIG. 5(b1) illustrate a timing waveform of a voltage being discharged with different RC-time constants according to another embodiment FIG. 5(b2) illustrated a schematic diagram of generating a clock to latch data in the cell branches in a single-end sensing scheme.
Figure 5:
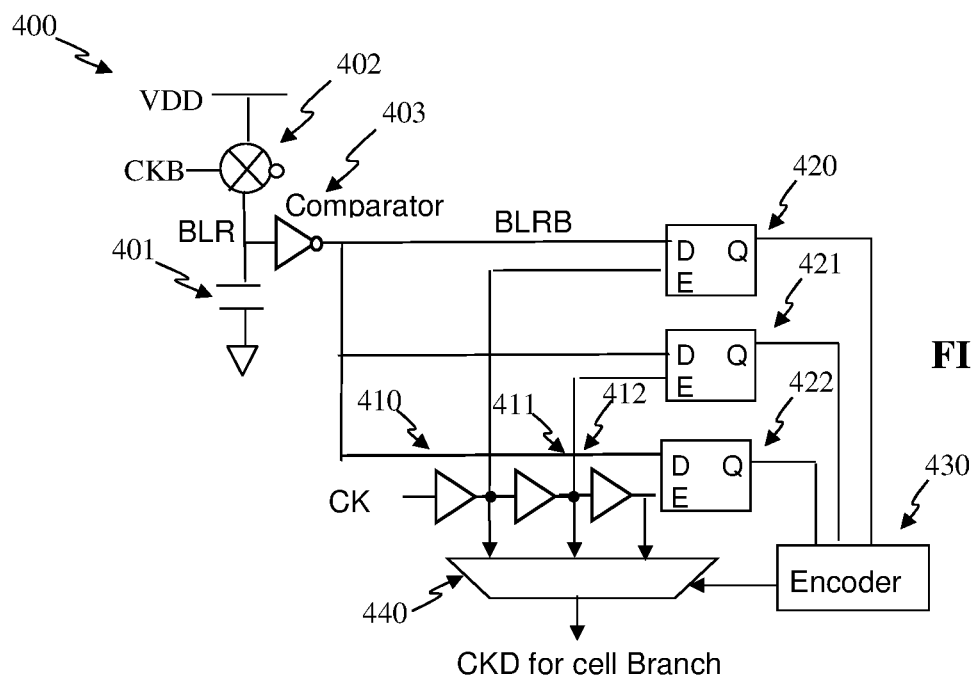
Figure 5:
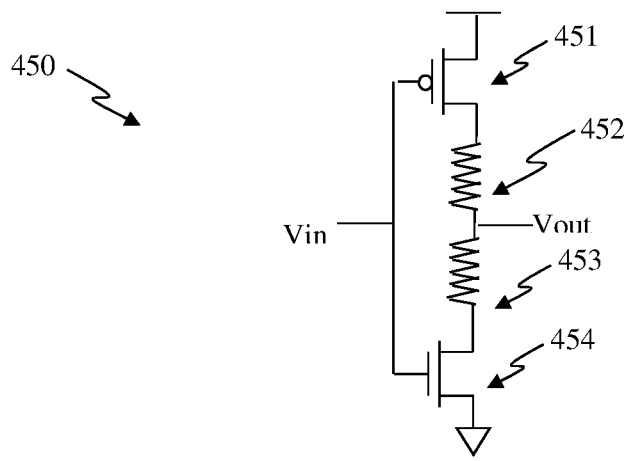
Figure 5:
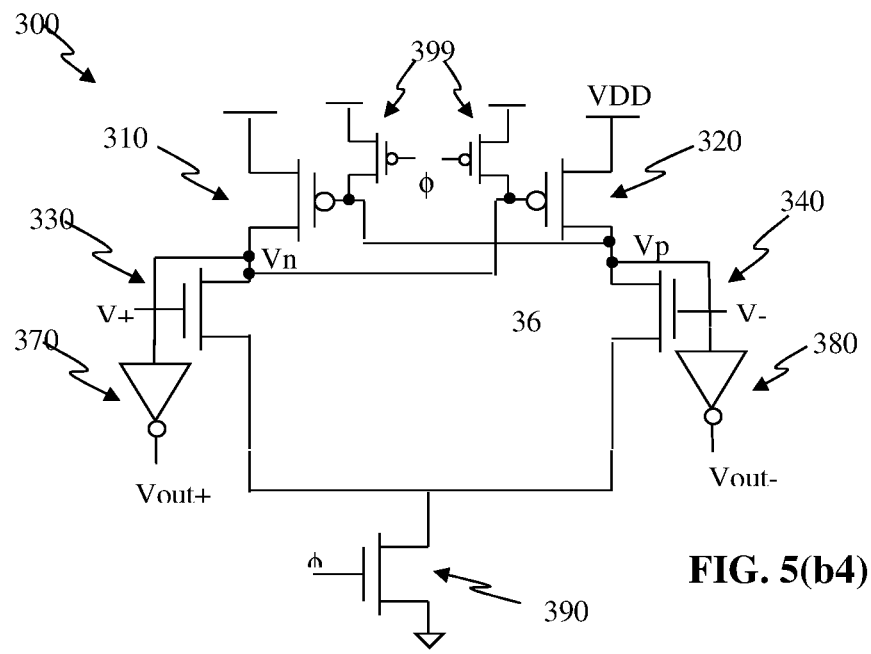
Figure 5:
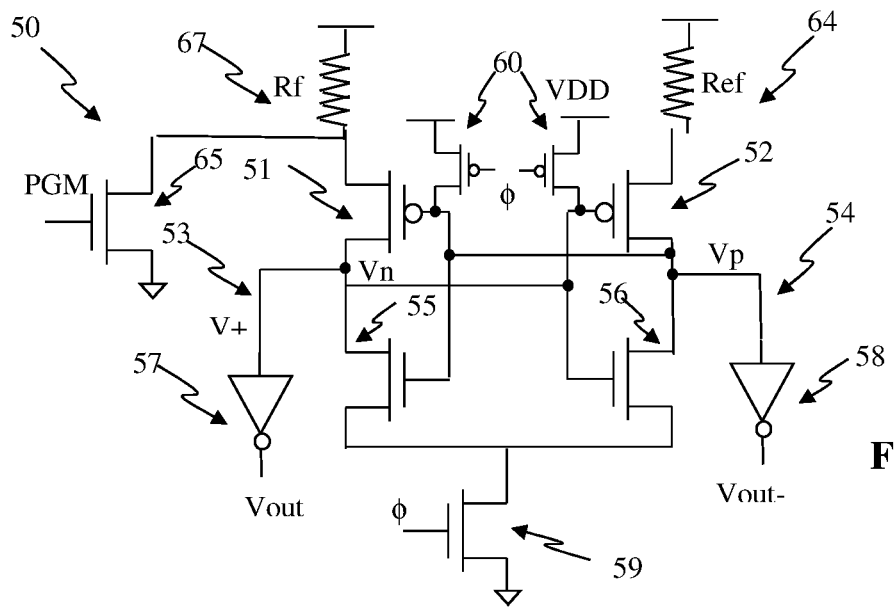
Figure 5:
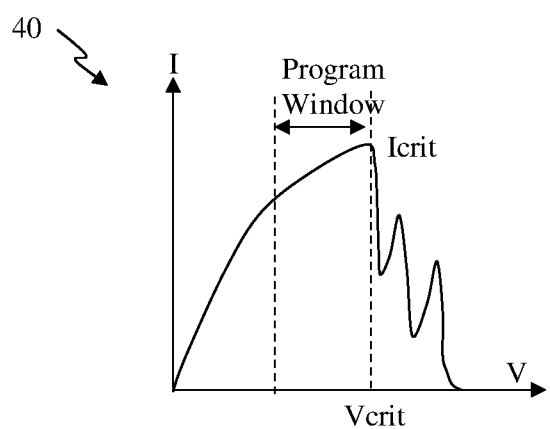
Figure 5:
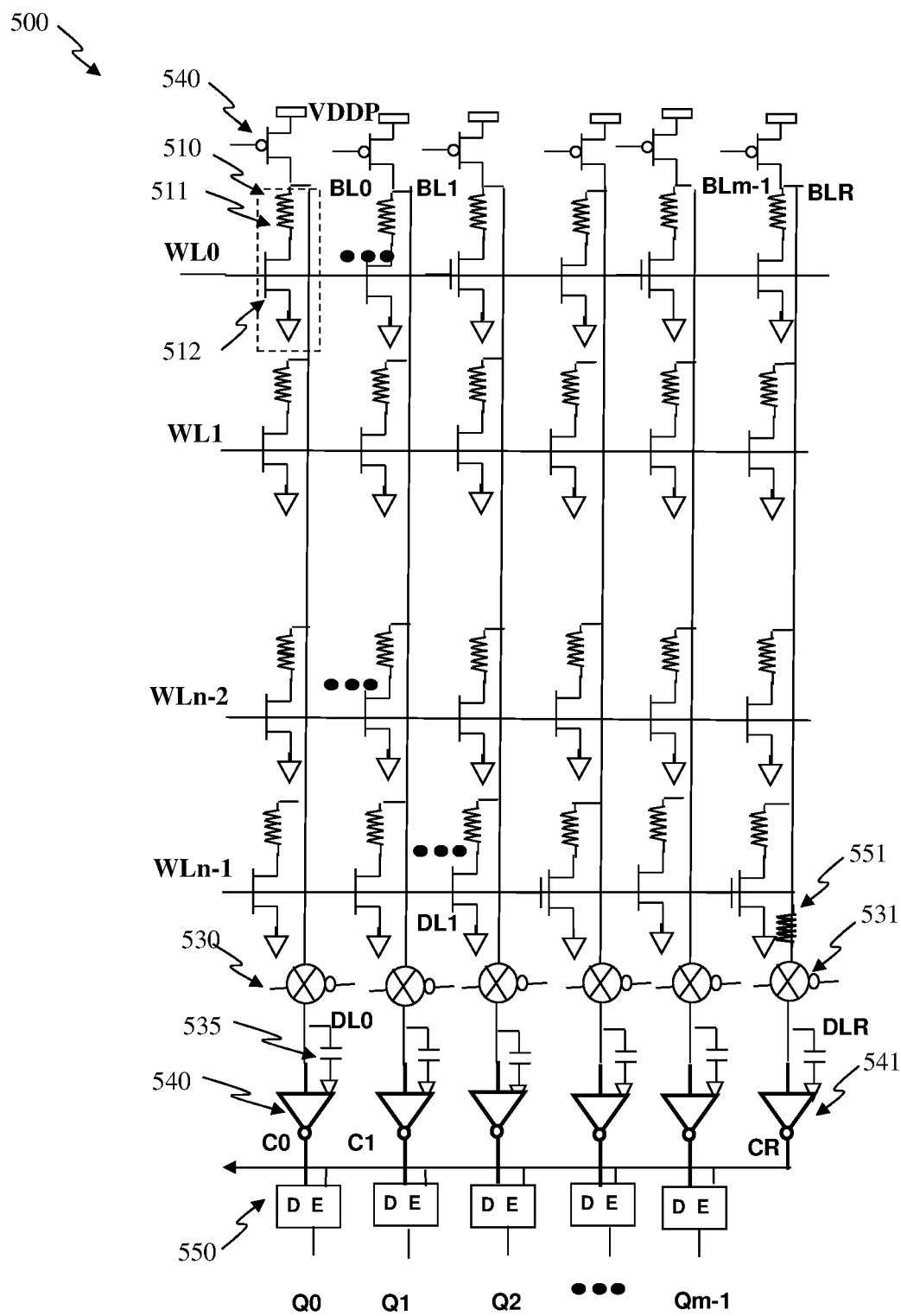
Figure 5:
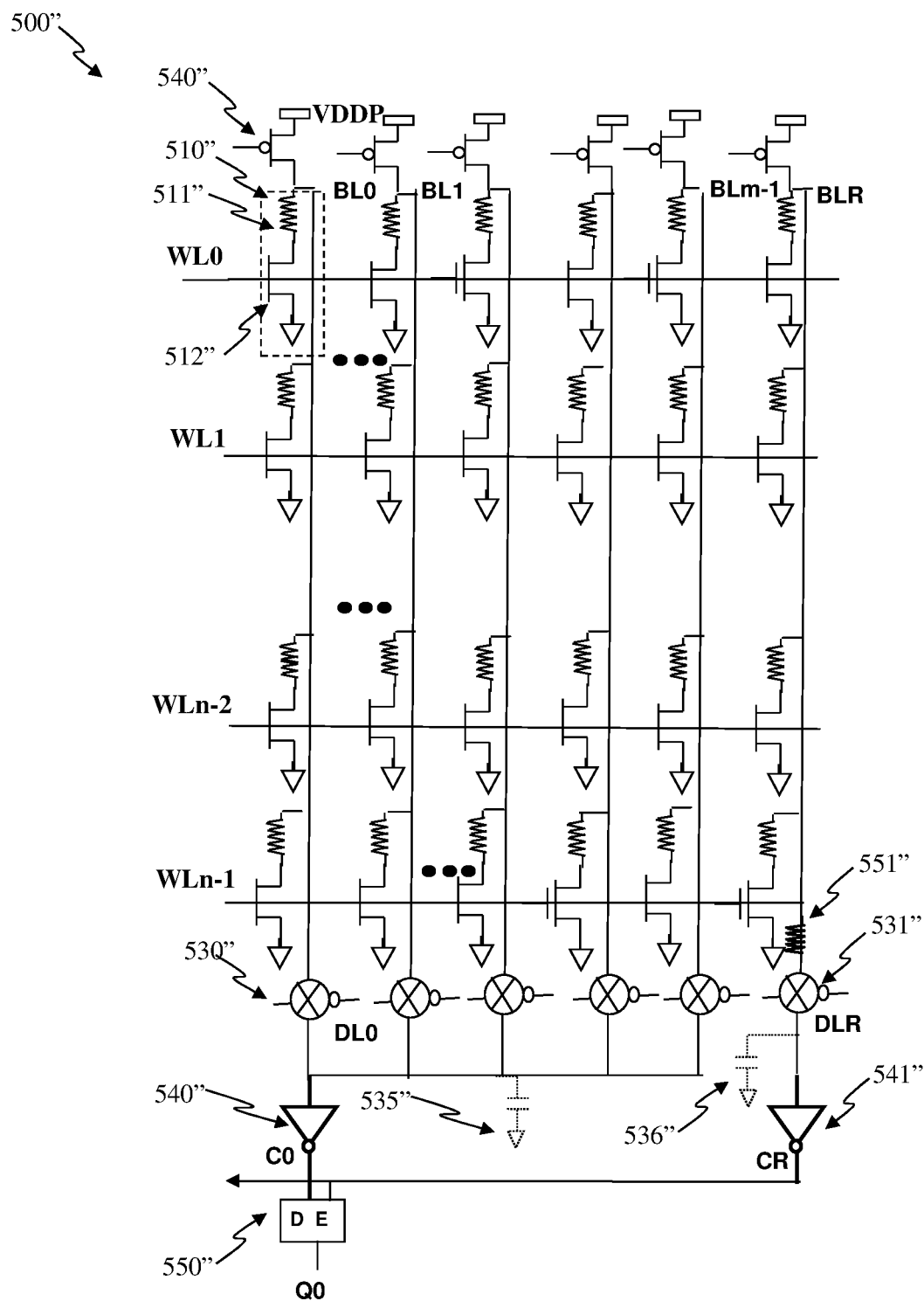

FIG. 5(b1) illustrates another timing waveform 200' of the capacitor voltages discharging according to other embodiments. The discharge curves 201', 202', and 203' are corresponding to the capacitor discharging of pre-program, reference, and post-program resistance, respectively. The three lines, 211', 212', and 213' are the outputs of the curves 201', 202', and 203' after comparators, respectively. The discharge curve 203' can be made slower by increasing the post-program resistance in the PRE cell by programming the cell harder in one embodiment. In another embodiment, the curves 201', 202' and 203' can be made slower by inserting a resistance offset in the PRE resistance in the cell or bitline and reference in the reference cell or reference bitline. In yet another embodiment, the output of the reference branch 212' can be replaced by a delayed clock so that the current in the reference branch can be saved, if the curves 201' and 203' are wide apart. The threshold of the comparator can be VDD/N, where N>1.

FIG. 5(b2) showed a portion of a schematic diagram 400 to generate a reference clock to latch data in a single-end sensing scheme. A delay clock can be calibrated once upon powering up or chip select, The circuit 400 has a reference discharge capacitor 401 coupled to ground and the other end BLR coupled to VDD through a pass gate 402. Node BLR is also coupled to a reference comparator 403 with an output BLRB. BLRB is coupled to inputs of latches 420, 421, and 422. The latch enables of 420, 421, and 422 are outputs of the clock CK after delays by buffers 410, 411, and 412, respectively. The outputs of latches 420, 421, and 422 are fed to an encoder 430 to select the suitable delayed clocks in MUX 440 to catch reference data changing logic states. Thus the discharge timing of the reference branch can be recorded in the reference clock. This clock can be used to latch data in the cell branch once calibrated so as to avoiding discharging reference branch cycle by cycle to save power. The numbers of the clock buffers and latches can vary in the other embodiment. The delay time of the clock can be calibrated during power up, chip select, or triggered by a signal.

FIG. 5(b3) shows a schematic diagram of another inverter based comparator 450 that has better threshold voltage control than the conventional inverter. The comparator 450 has a PMOS 451 with the source coupled to VDD and the drain coupled to a resistor 452. The resistor 452 has the other end coupled to another resistor 453, whose the other end is coupled to the drain of an NMOS 453. The source of NMOS 453 is coupled to ground. The gates of PMOS 451 and NMOS 454 are coupled to an input Vin. The node between the resistors 452 and 453 is the output of the comparator. In this comparator, the trip point of the inverter depends on the resistance ratio of the resistors 452 and 453. The PMOS 451 and NMOS 454 are used only as switches.

The schematic diagram and timing waveform showed in FIGS. 5(a) to 5(b3) are based on the signals substantially discharged, such as half VDD for example. This requires larger capacitors and more current consumption to provide sufficient voltage and timing margins between the reference and cell branches. Another embodiment is to sense the differential signals when the voltages discharged are very small, i.e., 100 mV.

FIG. 5(b4) shows a schematic diagram of a portion of a strobe comparator 300 that acts as an analog comparator and a latch. The schematic diagram 300 has a differential NMOS input 330 and 340, with gates V+ and V− (i.e., Bc and Br or Bc and Bcb of FIG. 5(b)) from the cell and/or reference branches. Their sources are coupled to the drain of another NMOS 390, whose gate is coupled to an enable signal ψ and source to ground. The drain of NMOS 330 and 340 are coupled to the gates of PMOS 320 and 310 and drains of PMOS 310 and 320, respectively in a crossed-coupled configuration. The sources of PMOS 310 and 320 are coupled to VDD. The drains of NMOS 330 and 340 are coupled to inputs of inverters 370 and 380 for outputs Vout+ and Vout−, respectively. Two small PMOS 399 are used to pull up the drains of NMOS 330 and 340 before activating the enable signal ψ. This strobe comparator can be very sensitive to any differential voltages, e.g. <100 mV between V+ and V− input, after small discharges from VDD. Thus, the discharging capacitors can be smaller to reduce the current consumption and/or the capacitors can be quickly re-charged after evaluation. After enabling ψ to latch the data, another NMOS half-latch (not shown) can be activated and the input nodes V+ and V− can be disabled from further discharging to save current. The strobe comparator 300 can have a pre-amplifier stage coupled between V+/V− and Br/Bc of FIG. 5(b), respectively, to reduce kick-back and unbalanced loads in Br and Bc in another embodiment. A differential pair with diode-connect PMOS as load is one embodiment for pre-amplifier. A source follower with cross-coupled pulldown is another embodiment for pre-amplifier. There are many variants and equivalent embodiments of strobe comparators and pre-amplifiers and they all fall into the scope of this invention.

The above descriptions in schematic diagrams and timing waveform from FIGS. (4) to 5(b) and 5(b4) are based on small resistance difference between unprogrammed and programmed OTP elements, i.e., 100 to 3 k, such that high sensitivity sensing is required. However, if the programmed to unprogrammed OTP element resistance ratio N can be made very high, such as 5 k to 100 k ohm (N=50) or even higher, sensing can be easier, i.e., single-end sensing becomes possible. Other than eliminating the reference branch and capacitor, the sensing circuits can consume less current.

FIG. 5(b5) shows a schematic diagram of a portion of another low-power sensing circuit 50 that can be applied to an OTP macro programmed with large post-/pre-program resistance ratio. An OTP element 67 and a reference resistance 64 with resistance Rf and Ref, are coupled to the sources of PMOS 51 and 52, respectively. The drains of PMOS 51 (Vn) and 52 (Vp) are coupled to the drains of NMOS 55 and 56, respectively. The gates of PMOS 51 and NMOS 55 are coupled to the drain of PMOS 52 (Vp). Similarly, the gates of the PMOS 52 and NMOS 56 are coupled to the drain of PMOS 51 (Vn). The sources of NMOS 55 and 56 are coupled to a drain of another NMOS 59, whose gate is coupled to an enable signal ψ and source to ground. The drains of NMOS 55 and 56 are coupled to inputs of inverters 57 and 58, respectively, to generate outputs Vout and Vout−. There are two small PMOS 60 with gates coupled to ψ, sources to VDD, and drains to Vn and Vp for pre-charging. The OTP element 67 and reference resistor 64 can be placed between the PMOS and NMOS cross-coupled inverter in another embodiment. The OTP element 67 and reference 64 can also be placed between source of NMOS 55 and 56 and drain of NMOS 59, respectively, in yet another embodiment. The resistance sensing can be activated during VDD ramping. In this embodiment, the NMOS 59 and PMOS pullup 60 can be omitted and the cross-coupled latch consists of PMOS 51, 52, NMOS 55, 56 can be activated upon ramping up VDD.

The schematic diagram 50 of a portion of an OTP cell showed in FIG. 5(b5) can be read and programmed and can also operate as a stand-alone OTP bitcell. For read, the enable signal ψ can go from low to high so that the nodes Vn and Vp can be sensed to 0 and 1, depending if the OTP element has very low or high resistance comparing to the reference resistance Ref, respectively. The enable signal ψ can be activated by raising a signal or from a power-on reset circuit to read all cells data at once. In another embodiment, the NMOS activation device 59 can be omitted and the OTP element resistance comparing with the reference can be sensed and stored into the latch upon raising VDD. This circuit can also be programmed by turning on the program control signal PGM and raise VDD to a higher voltage. The PGM signal can be from another decoder circuit in an OTP array to select a proper cell for programming. The OTP bit cell can also store data to be programmed for testing until satisfaction before actual programming. FIG. 5(b5) can be built as an OTP bitcell in a standard cell library while the decoders can be synthesized so that the whole OTP macro can be built by standard logic design flows.

The resistance before and after program needs to be controlled with fairly accurate and high post-/pre-program resistance ratio for the schemes in FIGS. 5(b1)-5(b5) to work. FIG. 5(b6) shows a procedure to achieve the objective. FIG. 5(b6) shows an I-V characteristic 40 of programming an OTP element, according to one embodiment. The I-V characteristic shows a voltage applied to the OTP element in the X-axis and the responding current is shown in the Y-axis. When the current is very low, the slope of the curve is the inversion of the initial resistance. As the current is increased, the resistance is increased due to Joule heat so that the curve bends toward the X-axis if the temperature coefficient is positive. At a critical point, Icrit, the resistance of the OTP element becomes negative due to rupture, material decomposition, melt, or thermal run away. If the programming current is below Icrit, the programming mechanism is solely based on electromigration. An OTP element can be programmed by applying multiple voltage or current pulses with progressive resistance changes until a satisfactory high resistance, e.g., from 100 to 50 k ohm, can be reached and sensed.

A method of programming a OTP element to achieve large post-/pre-program resistance ratio can include the following steps: (a) starting with a low program voltage initially to program a portion of an OTP memory and incrementing the program voltage until all OTP cells can be programmed and verified with large post-program resistance ratio, marked this voltage as a low bound of the program voltage, (b) continuously incrementing the program voltage to program a portion of OTP memory cells until at least one OTP cell, whether programmed or not, is verified failure in functionality or resistance ratio, marked the immediately previous voltage as a high bound of the program voltage. Incremental programming can happen on the same or another unprogrammed OTP cells in different embodiments. Furthermore, the program time can be adjusted to characterize the program window by repeating the above steps (a) and (b) accordingly until a low bound, high bound, or program window (voltage range between high and low bound) meets a target value. The program window of an OTP element with large resistance ratio is marked in FIG. 5(b6). After characterizing the program window, the other OTP cells can be programmed with a voltage half-way between the low and high bounds in at least one pulse.

A method of verifying the post-/pre-program OTP element resistance ratio can be achieved by reading the OTP element resistance with a reference. For example, two reference resistances 500 ohm and 49 k ohm can be designed to sense the OTP element resistance. If an unprogrammed OTP element is read pass with 500 ohm reference and a programmed OTP element is read pass with 49 k ohm, the large post-/pre-program resistance ratio can be verified. In another embodiment, a sensing circuit with low sensitivity can be used to check if the post-/pre-program OTP element resistance is wide enough. For example, if a sensing circuit that can sense any resistance below 1 k as unprogrammed and above 49 k ohm as programmed, this sensing circuit can be used to verify if the post-/pre-program OTP element resistance ratio is adequate. Another method to measure the OTP element resistance is by applying a low voltage to the program pin VDDP in program mode. Since the voltage applied is low enough not to cause accidental programming, the current flowing through VDDP can provide data about the OTP element resistance. The I(VDDP) current can be converted into OTP resistance by circuit simulation to verify post-/pre-program resistance ratio.

FIG. 5(c1) illustrates a schematic diagram of a portion of a block diagram 500 of a PRE macro incorporating the time-based sensing circuit, according to one embodiment of the present invention. The schematic diagram 500 has a plurality of PRE cells 510 organized as n row by m columns arrays and one additional reference column. Each PRE cell 510 has a PRE element 511 coupled to a selector 512. One end of PRE 510 is connected as a bitline (BL) in each column and is coupled to a Y-write Pass Gate (YWPG) 540 that further couples to VDDP for programming. Each bitline is also coupled to one or more of Y-read pass gate (YRPG) 530 as multiplexers to dataline (DL) and then each DL is coupled to a discharged capacitor 535 and a comparator 540. In another embodiment, each DL can be coupled to a plurality of bitlines.

Additionally, there is an additional reference resistor 551 coupled to the reference bitline (BLR) in a reference column. The comparator output of the normal column can be coupled to an input D of a latch 550, while the comparator output of the reference column can be coupled to the enable E of the latch 550. There can be PMOS pull-ups (not shown) to pre-charge DL0-DLm-1 and DLR to VDD before sensing. During sensing, the DL pre-charges are turned off, YRPG and WL are turned on, the selected DL in DLi (i=0, 1, . . . , m−1) and DLR will be discharged to ground through PRE element 511 and the reference resistance 551, respectively. When the DL and DLR voltage fall below a predetermined threshold, the comparator output Ci (i=0, 1, . . .

m−1) and CR will change logic state. CR can be used as a latch enable to latch the one or more Ci (i=0, 1, . . . m−1) to determine if the resistance of the PRE element is larger or smaller than the reference resistance.

FIG. 5(c2) illustrates a schematic diagram of a portion of a block diagram 500" of a PRE macro incorporating the time-based sensing circuit, according to another embodiment. The block diagram 500" has a plurality of PRE cells 510" organized as n row by m columns arrays and one additional reference column BLR. Each PRE cell 510" has a PRE element 511" coupled to a selector 512". The other end of PRE 510" connected as a bitline (BL) in each column is coupled to a Y-write Pass Gate (YWPG) 540" that further couples to VDDP for programming. Each bitline is also coupled to one or more of Y-read pass gate (YRPG) 530" as multiplexers to a single dataline (DL0). In this embodiment, all bitlines are multiplexed to a single dataline (DL0). Also, discharge capacitor 535" can be omitted, if the DL0 capacitance is larger enough. There is an additional reference resistor 551" coupled to the reference bitline in the reference column BLR. The comparator output of the normal column is coupled to an input D of a latch 550", while the comparator output of the reference column is coupled to the enable E of a latch 550". There can be PMOS pull-ups (not shown) to pre-charge DL0 and DLR to VDD before sensing. During sensing, the DL0/DLR pre-charge is turned off, YRPG 530", reference YRPG 531" and WL are turned on, and the selected BLi (i=0, 1, . . . , m−1) and BLR will be discharged to ground through PRE element 511" and the reference resistance 551", respectively. When the DL0 and DLR voltage fall below a pre-determined threshold, the comparator outputs C0 and CR will change logic state. CR can be used as a latch enable to latch C0 to determine if the resistance of the PRE element is larger or smaller than the reference resistance. In other embodiments, a reference capacitor 536" can be built to match the discharge capacitor 535".

The time-based sensing circuits 500 and 500" shown in FIGS. 5(c1) and 5(c2), respectively, are self-timed circuits. The reference column is placed in far right, for example, so that the reference cells in each wordline (WL) will be turned on the last. Dummy YRPG 530" or reference YRPG 531" can be placed to match the impedance in the normal bitlines, or as a multiplexer, respectively. During discharging, the reference comparator 541" can drive the enable signals of all latches to latch the cell data. Further, the signal CR can also be used to shut off the WL or YRPG to save power consumption. In these embodiments, the time delays of the cell and reference units can be tracked accurately. The reference cells can be placed in rows, rather than in columns as shown in FIG. 5(c1) or 5(c2).

Figure 5D:
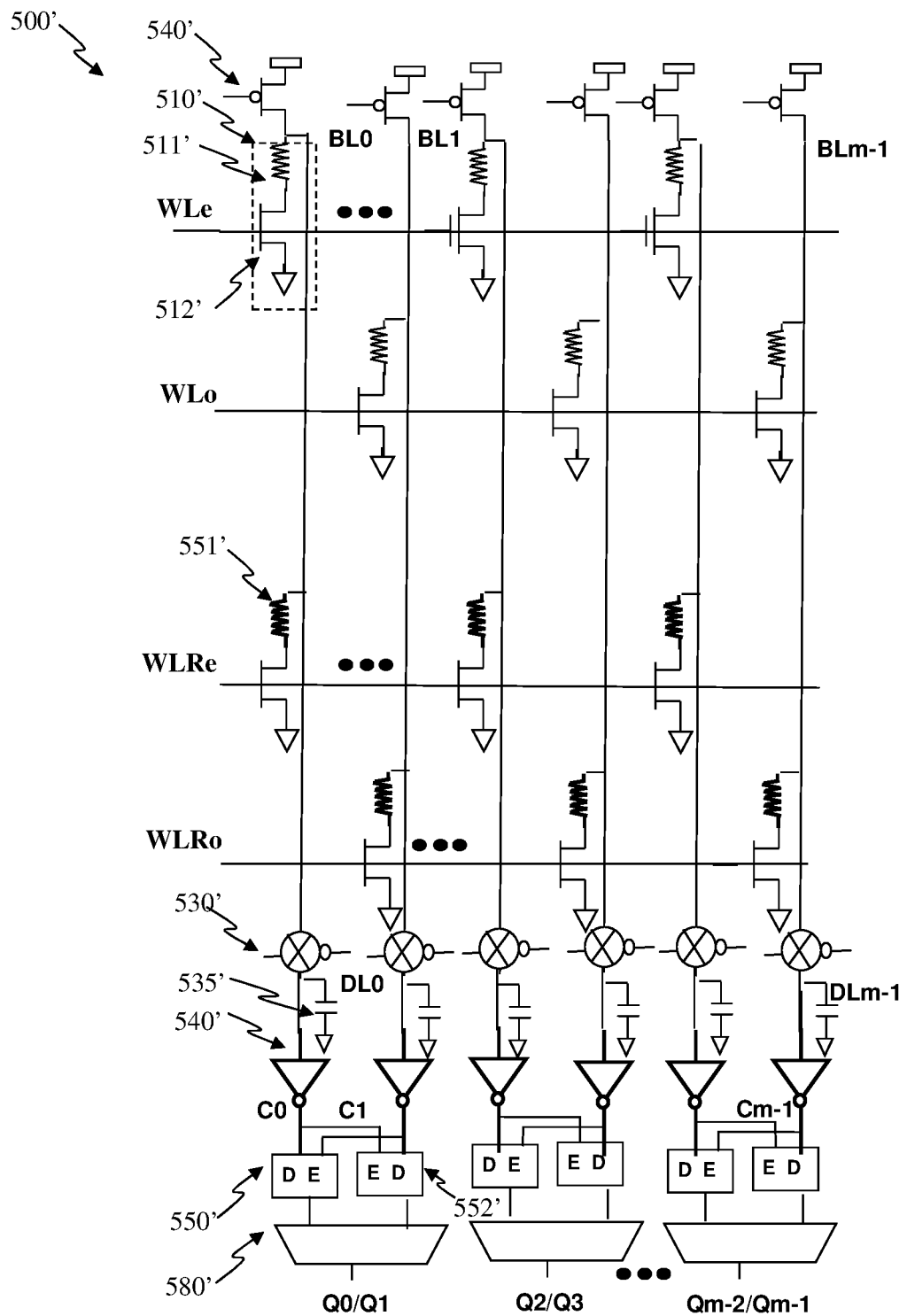
FIG. 5(d) illustrates a schematic diagram of a portion of a PRE memory utilizing time-base sensing using reference rows, according to another embodiment.

FIG. 5(d) illustrates a schematic diagram of a portion of a block diagram 500' of a PRE macro incorporating the time-based sensing circuit, according to one embodiment. The block diagram 500' has a plurality of PRE cells 510' organized as n row by m columns arrays and two additional reference rows WLRe and WLRo. Each PRE cell 510' has a PRE element 511' coupled to a selector 512'. One end of PRE 510' can be connected as bitline (BL) in each column and can be coupled to a Y-write Pass Gate (YWPG) 540' that further coupled to VDDP for programming. Each bitline is also coupled to one or more of Y-read pass gate (YRPG) 530' as multiplexers to dataline (DL) and then each DL is coupled to a discharged capacitor 535' and a comparator 540'. Each wordline (WL) is only connected to half of the cells. For example, the even WLs only connected to even columns cells and odd WLs only connected to odd columns cells. The two additional reference wordlines WLRe and WLRo have reference resistance in the cell are also connected in the same way as normal WLs. If even WL is turned on, the odd reference WL is also turned on and vice versa. By doing it this way, if one column has a cell turned on, the other column has a reference cell turned on, e.g. WLe and WLRo, which will be turned on at the same time. This is called self-reference in one pair of columns, i.e., one is coupled to a normal cell in the even column and the other coupled to a reference cell in an odd column. Therefore, the comparator outputs can be used to comparing the timing delays so as to determine cell resistance depending on which unit will reach VDD earlier. This can be done by coupling the comparator output of the cell unit to a latch input D and the reference unit to the latch enable E. For example, if the even cell in C0 is accessed, C0 is coupled to the latch input D and C1 is coupled to the enable input E of the latch 550' and vice versa. Another latch 552' does just the opposite. The two latches 550' and 552' are further multiplexed in an output multiplex 580' to select the proper output to generate Q0 and Q1. There are PMOS pull-ups (not shown) to precharge DL0-DLm-1 and DLR to VDD before sensing. During sensing, the DL pre-charges are turned off, YRPG and WL are turned on. At least one pair of DL will be discharged to ground through PRE element 511' and the reference resistance 551', respectively. When the DL voltages fall below a pre-determined threshold, the comparator output of a pair of column will change logic states. The comparator outputs C0 and C1 are coupled to input and enable of a latch to determine the PRE resistance. In this embodiment, the cell and reference branches can be tracked even better than in the reference column embodiment shown in FIG. 5(c1). The reference rows can be more than one pair to provide different reference resistance levels to be chosen from in the other embodiments. In another embodiment, the number of latches in a pair of column can be one with proper logic to determine proper cell and reference column so as to interpret the latch input and enable, respectively.

Figure 5E:
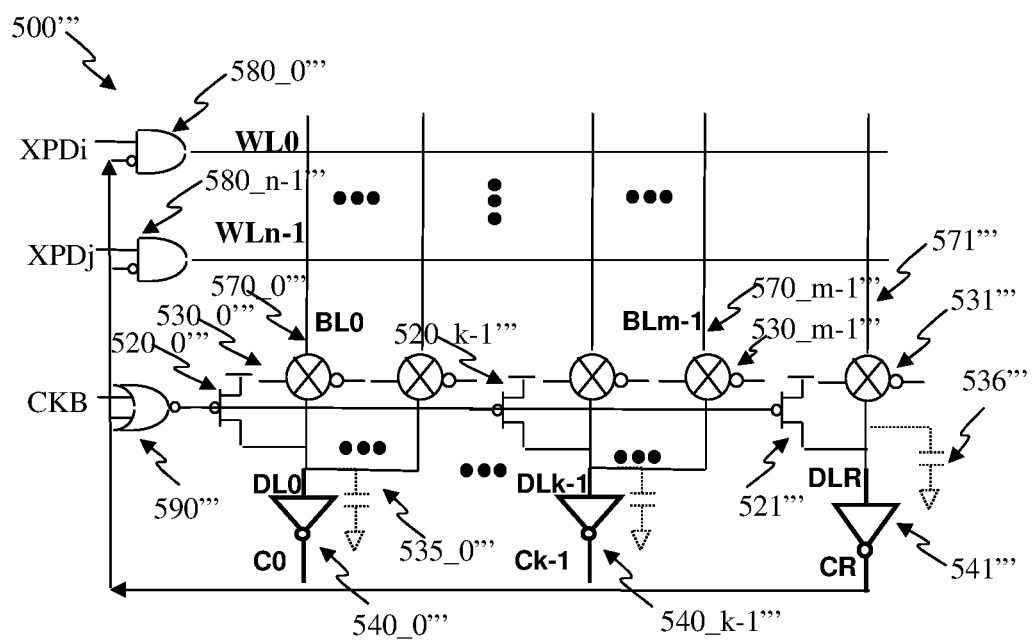
FIG. 5(e) illustrates a schematic diagram of a portion of a PRE memory utilizing self-timed circuit for pre-charge and discharge.

FIG. 5(e) shows a portion of a circuit in schematics 500''' to further illustrate a self-timed circuit. The circuit 500''' has a plurality of bitlines (BL), 570_0''' through 570_m-1''', or BL0 through BLm-1. Each bitline, BL0 through BLm-1, is coupled to at least one Y-Read Pass Gate (YRPG), 530_0''' through 530_m-1''', as a multiplexer. The outputs of the YRPGs are coupled to at least one dataline (DL). In this circuit, k datalines, DL0 through DLk-1, are outputs of the multiplexers YRPGs, 530_0''' through 530_m-1''', from m-bitline, BL0 through BLm-1, inputs for sensing. Each dataline is coupled to at least one pre-charge PMOS 520''', capacitor 535''' and comparator 540_0''' through 540_m-1. The same with the reference branch that includes at least one reference bitline BLR 571", reference YRPG 531''', reference dataline DLR, reference capacitor 536''', and reference comparator 541''', which are coupled to each other in similar configurations. For example, the DLR is coupled to the reference capacitor 536''' and the reference comparator 541''', which has an output CR. The CR is coupled to an input of NOR 590"; with the output coupled to the gates of PMOS pull-ups 520_0''' through 520_k-1'''; and reference PMOS pull-up 521'''. The other input of the NOR 590''' is coupled to CKB to turn on/off all PMOS pull-ups. The output CR of the reference comparator 541''' can also couple to an input of a plurality of NAND gates 580_0''' through 580_n-1''' with the outputs coupled to a wordlines (WL), WL0 through WLn-1, each. The other input of the NAND gates can be coupled to X-pre-decoders or decoders, such as XPDi or XPDj as shown, to generate n X-decoders. The cell array and the output latches are not shown for simplicity.

During pre-charging, all XPDs and YRPGs 530_0''' through **530_*m*-1'''; and 531''' are low and turned off, respectively. DL0 through DLk-1 and DLR can be pre-charged high to VDD by setting CKB high to turn on all PMOS pull-ups, 520_0''' through 520_k-1''' and 521''' accordingly. During sensing, the selected X-pre-decoders XPDj (j=0, 1, 2, . . . , n−1) are asserted to turn on a selected wordline, WL 580_0''' through 580_n-1'''. And at least one of the YRPGs, 530_0''' through 530_*m*-1''' and reference YRPG 531''' are also turned on. Then, CKB is set to low to turn off all PMOS pull-ups, 520_0'''; through 520_k-1'''; and 521'''. As a result, the datalines, DL0 through DLk-1, and reference dataline DLR can be discharged through the cell PRE and the reference PRE, respectively. Depending on the resistance of cell PREs and the reference PRE, datalines DL0 . . . DLk-1 and DLR can be discharged at different rates accordingly. When the DLR voltage drops to a pre-determined level, or half VDD for example, the reference comparator output CR will be switched from low to high. CR can be used to latch outputs C0 . . . Ck-1 into latches, where C0, . . . Ck-1 are the outputs of the comparators 540_0''' through 540_k-1''' with DL0 . . . DLk-1 as inputs, respectively. Latches can also be provided such as shown in FIGS. 5(c1), 5(c2), and 5(d), but not shown herein for simplicity. At the same time, CR de-asserts WL drivers 580_0''' through 580_n-1''' to prevent further discharging. CR can also turn on the NOR 590'''** for pre-charging and preparing for the next sensing cycle. Thus, pre-charging for the next sensing does not need to start from VSS so that energy can be saved. In other embodiments, the YRPGs can also be turned off after CR is asserted.

The circuits in FIGS. 5(c1), 5(c2), 5(d) and 5(e) are for illustrative purposes. There can be many different but yet equivalent embodiments that still fall within the scope of this invention. The numbers of row and column can vary. The numbers of datalines and sensing units can vary. As examples, there can be 1:1 ratio of bitlines to datalines, or there can be 1 to many ratio of datalines to bitlines. The number of the reference row/column can also vary. The reference row/column can be one per row, one per column, one per I/O, one per section, or can be a group of any rows/columns in a macro. The cells coupled to a wordline can be fully populated or half populated in different embodiments. The selector in the cell can be NMOS, PMOS, diode, merged MOS/diode, or bipolar, etc. The PRE cells, which can be 1R1T cells as noted above, can have a BL coupled to the source of the NMOS selector and the BL can couple to a shared NMOS in a column as YWPG and then further coupled to VSS, while the other end of the PRE can be coupled to VDDP directly in another embodiment. There can be more than one level or none of YWPG between BLs to VDDP for programming. There can be more than one level or none of YRPG between BLs to DLs for reading. In another embodiment, the additional DL capacitors can be omitted, but using intrinsic BL or DL loading as charging/discharging capacitor instead. In another embodiment, comparing time delays between cell and reference units can be during charging phase, instead of discharging phase.

The sensing circuits in FIG. 5(a)-5(e) are merely exemplary embodiments of the present invention. Many alterations or variations are possible. The pass gates can be embodied as NMOS, PMOS, or full CMOS pass gates. The capacitors can be made of MOS gate capacitor, Poly-Insulator-Poy (PIP), Metal-insulator-Metal (MIM) capacitor, or other type of capacitors. If MOS gate capacitor is used, thick oxide I/O devices are preferred over the core logic devices to reduce leakage current. The comparison devices (e.g., inverters or any logic gate) can be embodied as any kind of analog comparators or sense amplifiers, either static or dynamic comparators. The comparison devices can also be an arrangement of logic gates, such as inverters or Schmitt triggers to switch output when the input reaches certain voltage level. The reference voltage used for comparison can be any voltage between VDD and ground, though half VDD (Vdd/2) is a convenient voltage. The pass gates, e.g., pass gates 106 and 116 in FIG. 5(a), can be omitted in some embodiments. The time to charge capacitors can be made longer than discharging time to reduce peak current in some embodiments, i.e., charging or discharging duty cycle need not be 50%. A transparent latch (or flip-flop) can be used to latch the output data in some embodiments. There can be many different varieties and yet equivalent embodiments and they all fall into the scope of this invention.

The low-current sensing techniques described from FIGS. 4 to 5(e) are only for illustrative purposes. There can be many variations and yet equivalent embodiments that are still within the scope of this invention for those skill in the art. For example, the OTP cell can be a single or a plurality of cells in a one-dimensional or two-dimensional array. The OTP cell can be accessed via shift registers or randomly addressable. The sensing techniques can be single end or differential, static or dynamic, analog or digital. The reference resistors can be made of polysilicon, metal, or MOS devices. The capacitor in the sensing node can be intrinsic or extrinsic capacitor in the OTP array, MIM, or PIP capacitors provided by fabs. The cells can be sensed directly or through additional multiplexers (e.g. from bitline to dataline) to a sense amplifier. The sense amplifier can be a logic-gate based inverter or strobe comparator. The sense amplifier can also be like an inverter if the post- to pre-program OTP resistance ratio N is large enough. The ratio N can be larger than 50 or even 100, depending on the OTP programming behaviors. If the ratio N is high enough, there are even more low-current sensing circuits to be used to lower the read currents.

Figure 6:
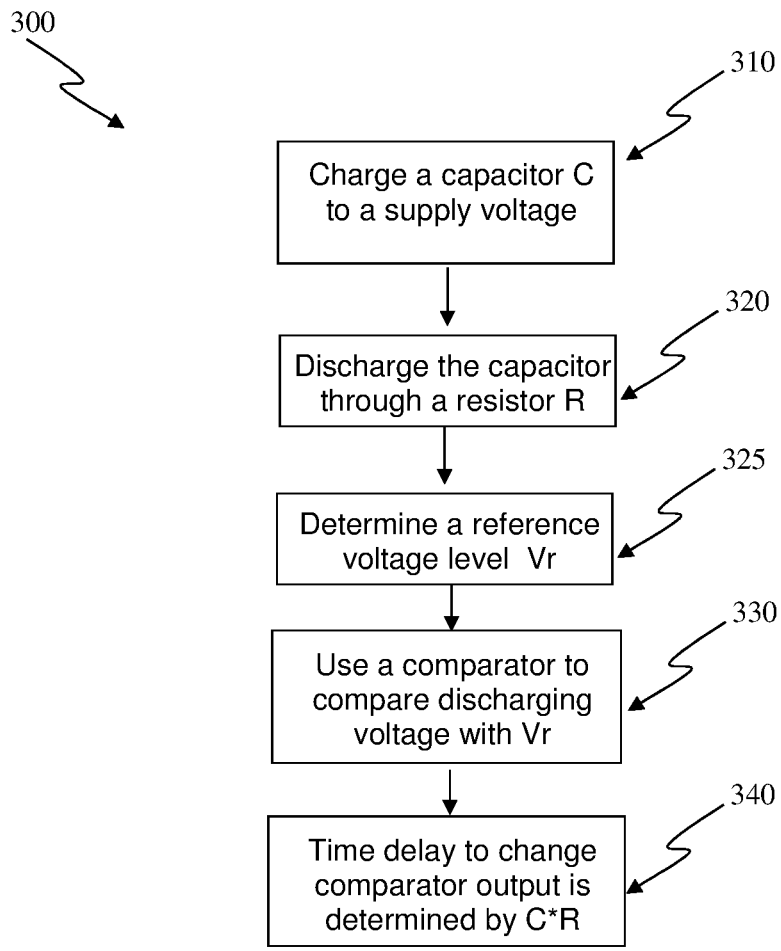
FIG. 6 shows a flow diagram of a method of converting resistance into time according to one embodiment.
Figure 7:
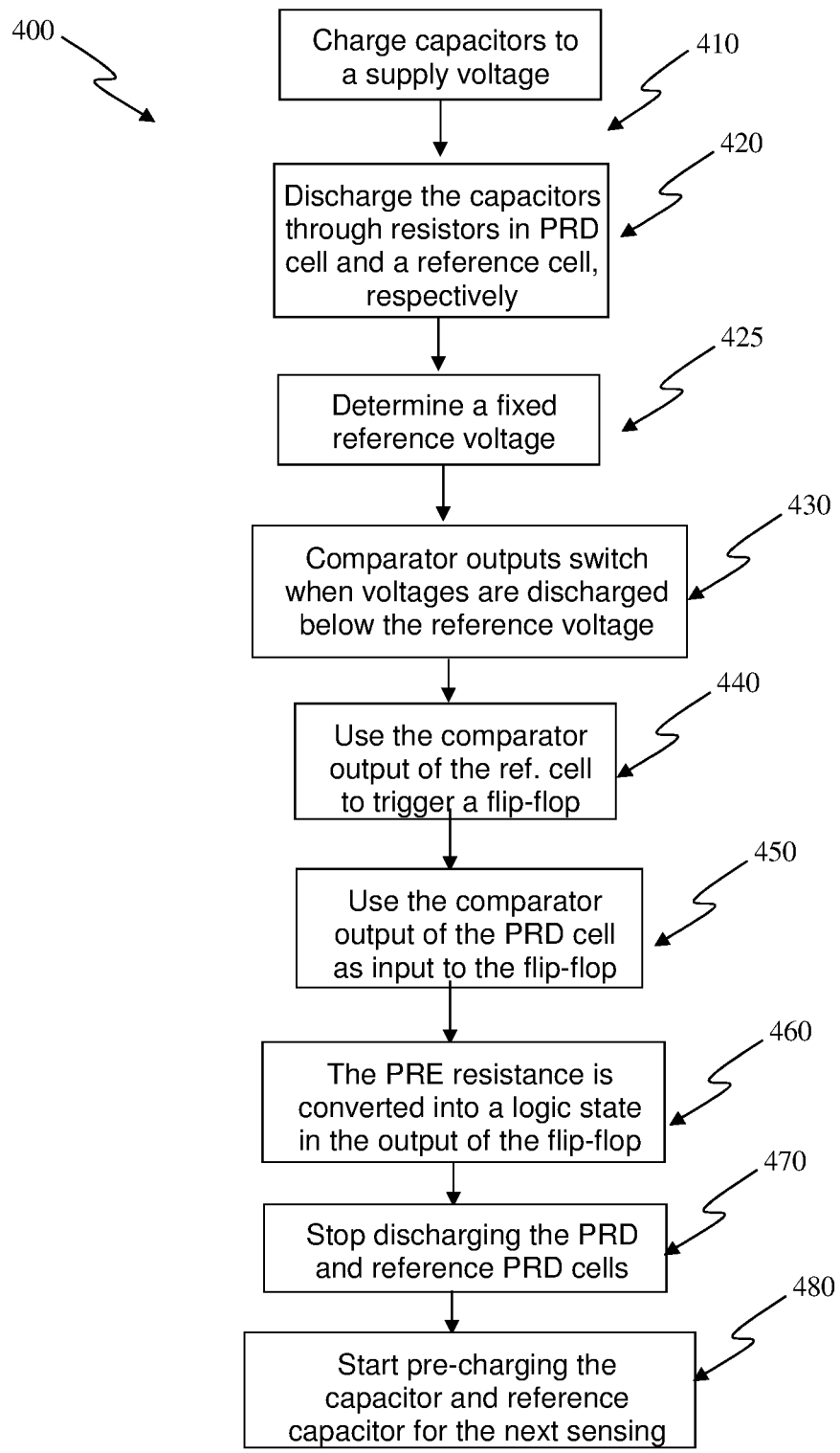
FIG. 7 shows a flow diagram of a method of time-based resistance sensing according to one embodiment.
Figure 7A:
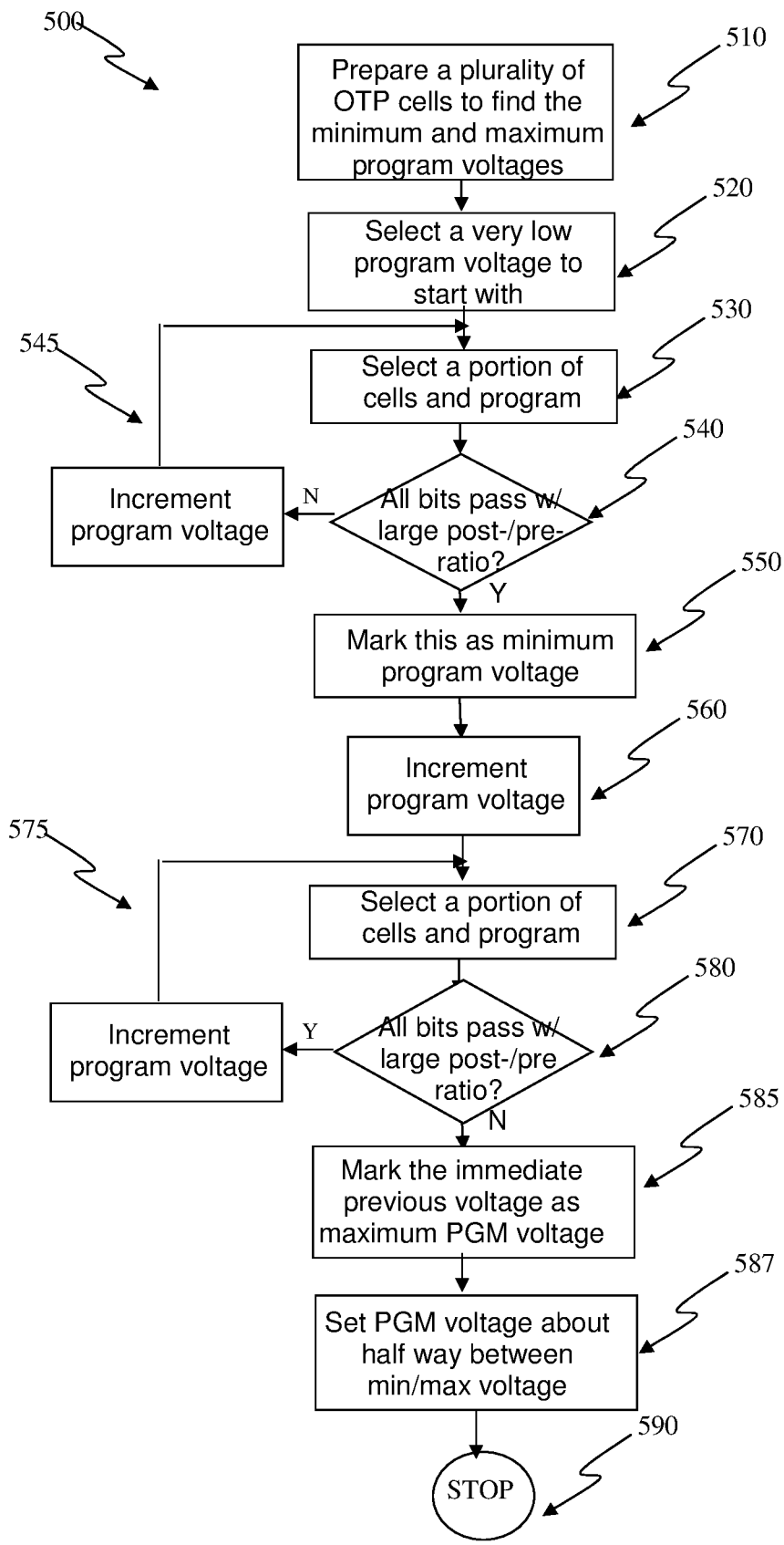
FIG. 7(a) shows a flow diagram of a method of programming an OTP with large post- to pre-program resistance ratio according to one embodiment.

FIGS. 6 and 7 show flow charts depicting embodiments of a time-based measuring resistance method 300 and a time-based reading method 400, respectively, for a programmable resistive memory in accordance with certain embodiments. The methods 300 and 400 are described in the context of a programmable resistive memory, such as the programmable resistive memory 500, 500'', 500' and 500''' in FIGS. 5(c1), 5(c2), 5(d), and 5(e). FIG. 7(a) shows a flow chart 500 depicting embodiments of finding a program window to reach a desirable high post-/pre-program resistance ratio. The method 500 is described in the context of an OTP programming behavior in FIG. 5(b6). In addition, although described as a flow of steps, one of the ordinary skilled in the art will recognize that at least some of the steps may be performed in a different order, including simultaneously, or skipped.

FIG. 6 is a flow diagram of a method 300 of converting resistance into time according to one embodiment. In the first step 310, a capacitor having a capacitance C is charged to near a supply voltage such as VDD. In the second step 320, the capacitor is discharged through a resistive device having a resistance R. In the third step 325, a fixed voltage is acquired as a reference voltage level Vr. The fixed voltage can be previously determined or determined when needed. In the fourth step 330, compare the discharging voltage with the reference voltage level to determine if the discharging voltage has reached the reference voltage level. In the fifth step 340, the time from starting discharging the capacitance C of the capacitor until discharging voltage is determined to be at or less than the reference voltage level is determined by R*C. Since the capacitance C is fixed, the resistance R can be determined accordingly.

FIG. 7 is a flow diagram of a method 400 of time-based resistance sensing according to one embodiment. The method 400 can use a PRD cell and a reference unit. In the step 410, at least two capacitors are charged to near a supply voltage VDD. One capacitor is part of the PRD cell unit, and another capacitor is part of the reference unit. In the step 420, the two capacitors are discharged through a Programmable Resistive Element (PRE) and a reference element, respectively. The PRD cell includes the PRE, and the reference unit includes the reference element. In one implementation, the discharging can be initiated by turning on selectors. In the step 425, a fixed reference voltage is determined to check the discharging voltage level. In the step 430, the fixed reference voltage can be compared with the discharged voltages by comparators. The comparator outputs can be independently changed when the voltages are discharged below the reference voltage level. In the step 440, the comparator output of the reference unit can be used to turn on a latch (or flip-flop) when the discharge voltage level in the reference unit is below the reference voltage level. In the step 450, the comparator output of the PRD cell is used as an input to the latch (or flip-flop). In the step 460, the output of the latch (or flip-flop) is a logic state for the PRE resistance. In the step 470, the capacitor discharging is disabled. In the step 480, the capacitor and reference capacitor are pre-charged again to prepare for the next sensing.

FIG. 7(*a*) depicts a flow chart of a programming method 500 to reach a desirable high post-/pre-program OTP resistance ratio according to one embodiment. In the first step 510, select a plurality of cells to program. In the second step 520, select a very low program voltage to start with. In the third step 530, select a portion of OTP cells and program them. In the fourth step 540, check if all bits are programmed pass and with desirable post-/pre-program resistance ratio. If no, increment the program voltage and select another portion of OTP cells to program again in step 545. If yes, mark this voltage as the minimum voltage to reach the desirable high post-/pre-program resistance ratio in step 550. Then, still increment the program voltage in step 570. In step 580, check if all cells pass the large post-/pre-program resistance ratio. If yes, increase the program voltage in step 575 and go to programming again in step 570. If no, the program voltage is too high and mark the immediately previous voltage as the maximum program voltage to reach the desirable high post-/pre-program resistance ratio in 585. Then, select a suitable program voltage, about half way, between the minimum and maximum voltage for programming in step 587. Finally, this procedure can stop at 590. The same procedure can be applied to find the minimum and maximum program time.

Figure 8:
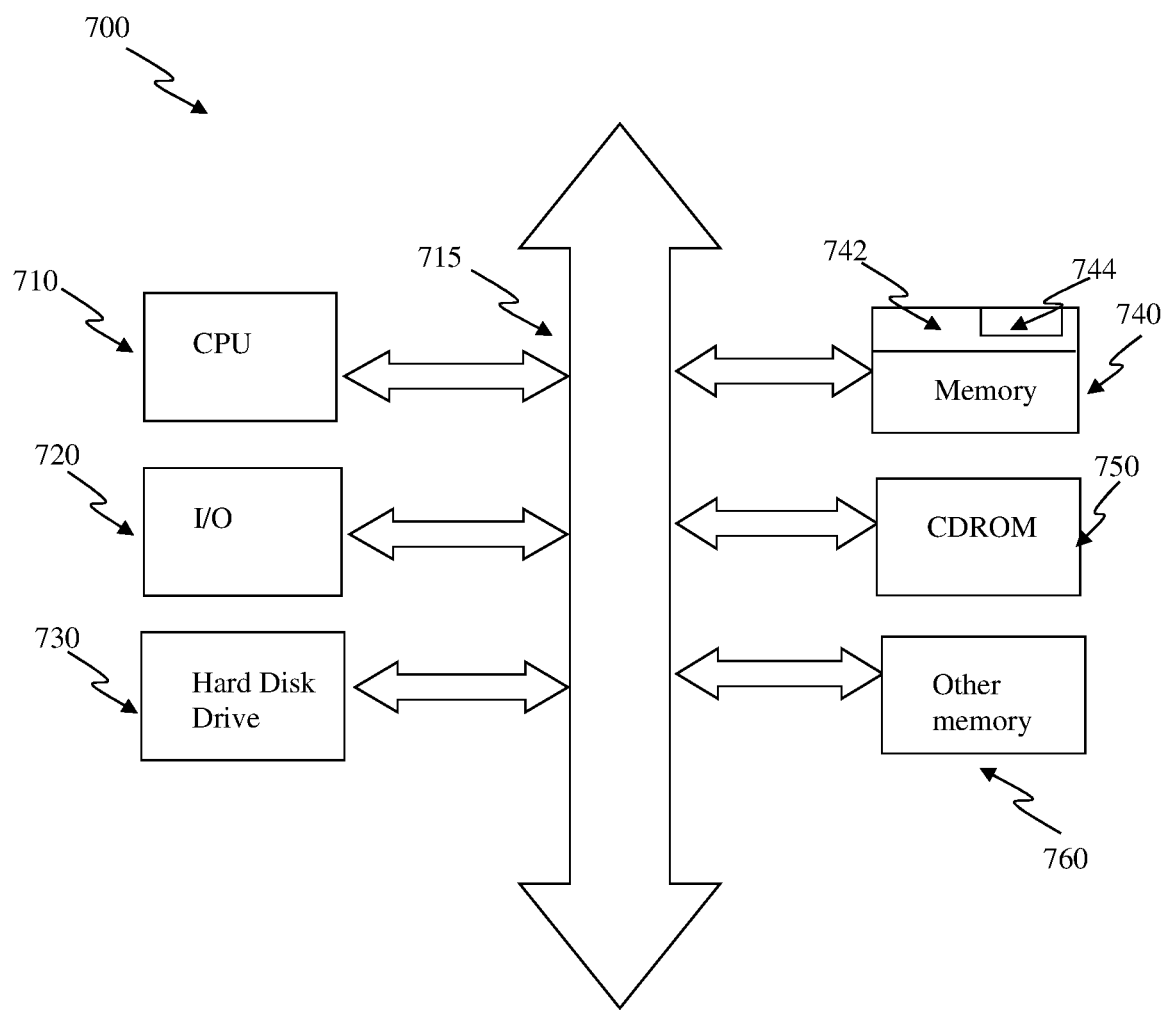
FIG. 8 shows a processor system with at least one programmable resistive memory using low voltage and low current sensing circuit, according to one embodiment.

FIG. 8 shows a processor system 700 according to one embodiment. The processor system 700 can include a programmable resistive device 744 and a time-base sensing circuit 742, in a programmable resistive memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, programmable resistive memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Programmable resistive memory 740 is preferably constructed as an integrated circuit, which includes a plurality of programmable resistive devices 744 in a memory array and at least one time-base sensing circuit 742. The programmable resistive memory 740 typically interfaces to CPU 710 with simple interface control or through a memory controller. If desired, the programmable resistive memory 740 may be combined with the processor, for example CPU 710, in a single integrated circuit.

If the PRE is an One-Time Programmable (OTP) element, such as an electrical fuse, a method of programming a fuse reliably can include the following steps: (a) starting with a low program voltage initially to program a portion of an OTP memory and incrementing the program voltage until all planned OTP cells can be programmed and verified pass, marked this voltage as a low bound of the program voltage, (b) continuously incrementing the program voltage to program another portion of OTP memory cells until at least one OTP cell, whether programmed or not, is verified failure, marked this voltage as a high bound of the program voltage. Incremental programming can happen on the same or another unprogrammed OTP memories in different embodiments. Furthermore, the program time can be adjusted to characterize the program window by repeating the above steps (a) and (b) accordingly until a low bound, high bound, or program window (voltage range between high and low bound) meets a target value. The window of programming an electrical fuse reliably can be found accordingly. After characterizing the program window, the other OTP cells can be programmed with a voltage between the low and high bounds in at least one pulse.

The invention can be implemented in a part or all of an integrated circuit in a Printed Circuit Board (PCB), or in a system (electronic system, computing system, etc.). The programmable resistive memory can be fuse, anti-fuse, or emerging nonvolatile memory. The fuse can be silicided or non-silicided polysilicon fuse, metal fuse, MOS gate, local interconnect, thermally-isolated-active-area fuse, contact fuse, via fuse, or FinFET itself. The anti-fuse can be a gate-oxide breakdown anti-fuse, contact or via anti-fuse with dielectrics in-between. The emerging nonvolatile memory can be Magnetic RAM (MRAM), Phase Change Memory (PCM), Conductive Bridge RAM (CBRAM), Ferroelectric RAM (FeRAM) or Resistive RAM (RRAM). Though the program mechanisms are different, their logic states can be distinguished by different resistance values. The semiconductor can also be fabricated by amorphous, polysilicon, or organic semiconductor thin-film substrate, in the so-called Thin-Film Transistor (TFT) technologies, instead of crystalline silicon technologies, such as bulk or SOI (Silicon-On-Insulator) technologies.

This application incorporates by reference: (1) U.S. Provisional Patent Application No. 62/485,895, filed on Apr. 14, 2017 and entitled "CIRCUIT AND SYSTEM OF ULTRA LOW VOLTAGE AND LOW CURRENT READ FOR PROGRAMMABLE RESISTIVE MEMORIES;" AND (2) U.S. patent application Ser. No. 15/953,422, filed on Apr. 14, 2018 and entitled "LOW POWER READ OPERATION FOR PROGRAMMABLE RESISTIVE MEMORIES."

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An One-Time Programmable (OTP) memory comprises:
a plurality of OTP cells, each of the OTP cells including at least an OTP element coupled to a selector;
the OTP element in at least one of the OTP cells is coupled to a first supply voltage line; and
the selector in at least one of the OTP cells includes an enable signal and is coupled to a second supply voltage line,
wherein the at least one OTP cell is configured to be programmable within a minimum program voltage and a maximum program voltage by applying voltages to the first, second, and/or the enable signal to program the at least one OTP cell into another resistance state, and
wherein at least one of the OTP resistance states have the post-program to the pre-program resistance ratio larger than N when programmed within the minimum and the maximum program voltage range.

2. An OTP memory as recited in claim 1, wherein the post-program to the pre-program resistance ratio N denotes that the post-program is at least several times larger than the pre-program resistance.

3. An OTP memory as recited in claim 1, wherein the post-program to pre-program resistance ratio N is larger than 50.

4. An OTP memory as recited in claim 1, wherein a plurality of the OTP cells are coupled to a common bitline which is further coupled to the first supply voltage line.

5. An OTP memory as recited in claim 1, wherein a plurality of the OTP cells are coupled to a common bitline which is further coupled to the first supply voltage line via a plurality of datelines through multiplexers.

6. An OTP memory as recited in claim 5, the at least one of the bitline or dateline is coupled to a comparator, wherein the comparator consists of a CMOS inverter with two resistors coupled between the drains of the PMOS and NMOS. The node between the two resistors is the output of the comparator.

7. An OTP memory as recited in claim 6, wherein the resistance of the OTP element is converted into logic state by strobing the comparator output of the at least one discharging bitline/dataline by a reference clock.

8. An OTP memory as recited in claim 7, wherein the reference clock is produced by generating a plurality of delayed clocks to latch the same comparator output from a discharging reference bitline/dataline, encoding and recording the clock that catch the first comparator output changing logic states.

9. An OTP memory as recited in claim 1, wherein at least one of the OTP elements is an electrical fuse that consists of polysilicon, silicided polysilicon, CMOS gate, metal, thermally isolated active region, fin structure, and thereof.

10. An electronic system, comprising:
a processor; and
a one-time programmable (OTP) memory operatively connected to the processor, the OTP memory includes at least a plurality of OTP cells for providing data storage, each of the OTP cells comprising:
a one-time programmable (OTP) element coupled to a selector that has an enable signal;
the OTP element is coupled to a first supply voltage line; and
the selector is coupled to a second supply voltage line,
wherein the at least one OTP cell is configured to be programmable within a minimum program voltage and a maximum program voltage by applying voltages to the first, second, and/or the enable signal to program the OTP cell into another resistance state, and
wherein the OTP element in the resistance states has a minimum resistance ratio N between post- and pre-program OTP element resistance.

11. An electronic system as recited in claim 10, wherein the minimum resistance ratio N between post- and pre-program OTP element resistance denotes that the post-program OTP element resistance is at least several times larger than the pre-program OTP element resistance.

12. An electronic system as recited in claim 10, wherein the ratio N is at least 50 between programmed and unprogrammed states.

13. An electronics system as recited in claim 10, wherein the plurality of the OTP cells are coupled to a common bitline which is further coupled to the first supply voltage line.

14. An electronics system as recited in claim 10, wherein the plurality of the OTP cells are coupled to a common bitline which is further coupled to the first supply voltage line via a plurality of datelines through multiplexers.

15. An electronics system as recited in claim 10, the at least one of the bitine or dateline coupled to at least one comparator, wherein the comparator consists of a CMOS inverter with two resistors coupled between the drains of the PMOS and NMOS, wherein the node between the two resistors is the output of the comparator.

16. An electronics system as recited in claim 10, wherein the resistance of the OTP element can be converted into logic states by strobing the bitline or dateline comparator output by a reference clock.

17. An OTP memory as recited in claim 16, wherein the reference clock is produced by generating a plurality of delayed clocks to latch the same comparator output from a discharging reference bitline/dataline, encoding and recording the clocks that catch the first comparator output changing logic states.

18. A method for operating a one-time programmable (OTP) memory, the OTP memory including a plurality of OTP cells, at least one of the OTP cells including a plurality of OTP elements and at least one selector, the OTP elements being coupled to the at least one selector, at least one of the OTP elements being coupled to a first supply voltage line and the at least one selector being coupled to a second supply voltage line, and wherein the method comprises:
coupling at least one of the OTP cells to a common bitline, which is further coupled to the first supply voltage;
coupling the at least one of the bitline to a comparator to convert bitline voltage into logic states;
coupling the at least one of the bitline to at least one capacitor which can be discharged through the OTP element when evaluate the data in the OTP cell; and
converting the resistance in the at least OTP cell into a logic state by strobing the bitline comparator output by a reference clock.

19. A method as recited in claim 18, wherein the method of generating the reference clock comprises:
provautomaty at least one reference bitline coupled to a reference comparator;
providing a plurality of delayed clocks to latch the output of the same comparator;
encoding the latch outputs to find the first reference bitline changing logic states; and
selecting and recording the delayed clocks that catch the first latch output changing logic states.

20. A method as recited in claim 18, wherein the comparator comprises an inverter with two resistors coupled between the drains of the NMOS and PMOS, and wherein a node between the two resistors is the output of the comparator.

* * * * *